(12) United States Patent
Lin et al.

(10) Patent No.: US 12,142,637 B2
(45) Date of Patent: Nov. 12, 2024

(54) SEMICONDUCTOR DEVICE AND METHOD OF MANUFACTURING THE SAME

(71) Applicant: TAIWAN SEMICONDUCTOR MANUFACTURING COMPANY, LTD., Hsinchu (TW)

(72) Inventors: Cheng-Yu Lin, Hsinchu (TW); Yi-Lin Fan, Hsinchu (TW); Hui-Zhong Zhuang, Hsinchu (TW); Sheng-Hsiung Chen, Hsinchu (TW); Jerry Chang Jui Kao, Hsinchu (TW); Xiangdong Chen, Hsinchu (TW)

(73) Assignee: TAIWAN SEMICONDUCTOR MANUFACTURING COMPANY, LTD., Hsinhu (TW)

( * ) Notice: Subject to any disclaimer, the term of this patent is extended or adjusted under 35 U.S.C. 154(b) by 147 days.

(21) Appl. No.: 17/575,590

(22) Filed: Jan. 13, 2022

(65) Prior Publication Data
US 2022/0416026 A1    Dec. 29, 2022

Related U.S. Application Data

(60) Provisional application No. 63/221,699, filed on Jul. 14, 2021, provisional application No. 63/216,329, filed on Jun. 29, 2021.

(51) Int. Cl.
*H01L 29/06* (2006.01)
*H01L 23/522* (2006.01)
(Continued)

(52) U.S. Cl.
CPC ...... *H01L 29/0696* (2013.01); *H01L 23/5226* (2013.01); *H01L 29/401* (2013.01); *H01L 29/4238* (2013.01)

(58) Field of Classification Search
CPC ............ H01L 29/0696; H01L 23/5226; H01L 29/401; H01L 29/4238; H01L 21/823828;
(Continued)

(56) References Cited

U.S. PATENT DOCUMENTS 7,260,442 B2   8/2007   Hwang et al.
9,256,709 B2   2/2016   Yu et al.
(Continued)

*Primary Examiner* — Shahed Ahmed
*Assistant Examiner* — Khatib A Rahman
(74) *Attorney, Agent, or Firm* — Hauptman Ham, LLP

(57) ABSTRACT

A cell region of a semiconductor device includes a first and second isolation dummy gates extending along a first direction. The semiconductor device further includes a first gate extending along the first direction and between the first isolation dummy gate and the second isolation dummy gate. The semiconductor device includes a second gate extending along the first direction, the second gate being between the first isolation dummy gate and the second isolation dummy gate relative to a second direction perpendicular to the first direction. The semiconductor device also includes a first active region and a second active region. The first active region extending in the second direction between the first isolation dummy gate and the second isolation dummy gate. The first active region has a first length in the second direction, and the second active region has a second length in the second direction different from the first length.

20 Claims, 22 Drawing Sheets

(51) Int. Cl.
*H01L 29/40* (2006.01)
*H01L 29/423* (2006.01)

(58) Field of Classification Search
CPC ... H01L 2027/11831; H01L 21/823878; H01L 27/0207; H01L 27/092; H01L 21/823807; H01L 27/0924
See application file for complete search history.

(56) References Cited

U.S. PATENT DOCUMENTS

| | | | |
|---|---|---|---|
| 10,050,058 B2 * | 8/2018 | Song | G06F 30/30 |
| 10,096,546 B2 * | 10/2018 | Yoon | H01L 23/5283 |
| 10,297,596 B2 * | 5/2019 | Sharma | H01L 27/0886 |
| 10,347,627 B2 * | 7/2019 | Cho | H01L 27/088 |
| 10,522,528 B2 * | 12/2019 | Liaw | H01L 27/0928 |
| 10,622,999 B2 * | 4/2020 | Song | H01L 27/0207 |
| 10,840,147 B1 * | 11/2020 | Li | H01L 27/0924 |
| 2011/0147765 A1 * | 6/2011 | Huang | H01L 27/0207 |
| | | | 257/E27.06 |
| 2014/0040838 A1 | 2/2014 | Liu et al. | |
| 2015/0278429 A1 | 10/2015 | Chang | |
| 2020/0126901 A1 * | 4/2020 | Chen | H01L 23/50 |
| 2020/0135869 A1 * | 4/2020 | Ciou | H01L 29/7833 |
| 2021/0391376 A1 * | 12/2021 | Chen | H01L 27/14634 |

* cited by examiner

SEMICONDUCTOR DEVICE AND METHOD OF MANUFACTURING THE SAME

CROSS REFERENCE TO RELATED APPLICATIONS

This application claims the benefit of U.S. Provisional Application No. 63/216,329, filed on Jun. 29, 2021, and U.S. Provisional Application No. 63/221,699, filed on Jul. 14, 2021, the disclosure of each of which is hereby incorporated by reference in its entirety.

BACKGROUND

When a semiconductor device such as a metal-oxide-semiconductor field-effect transistor (MOSFET) is scaled down through various technology nodes, device packing density and device performance can be compromised by device layout and isolation. In order to avoid leakage between neighboring devices (cells), the gates may be isolated from each other by replacing an isolation dummy gate at a cell edge. Further, the isolation dummy gate also disconnects active regions.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
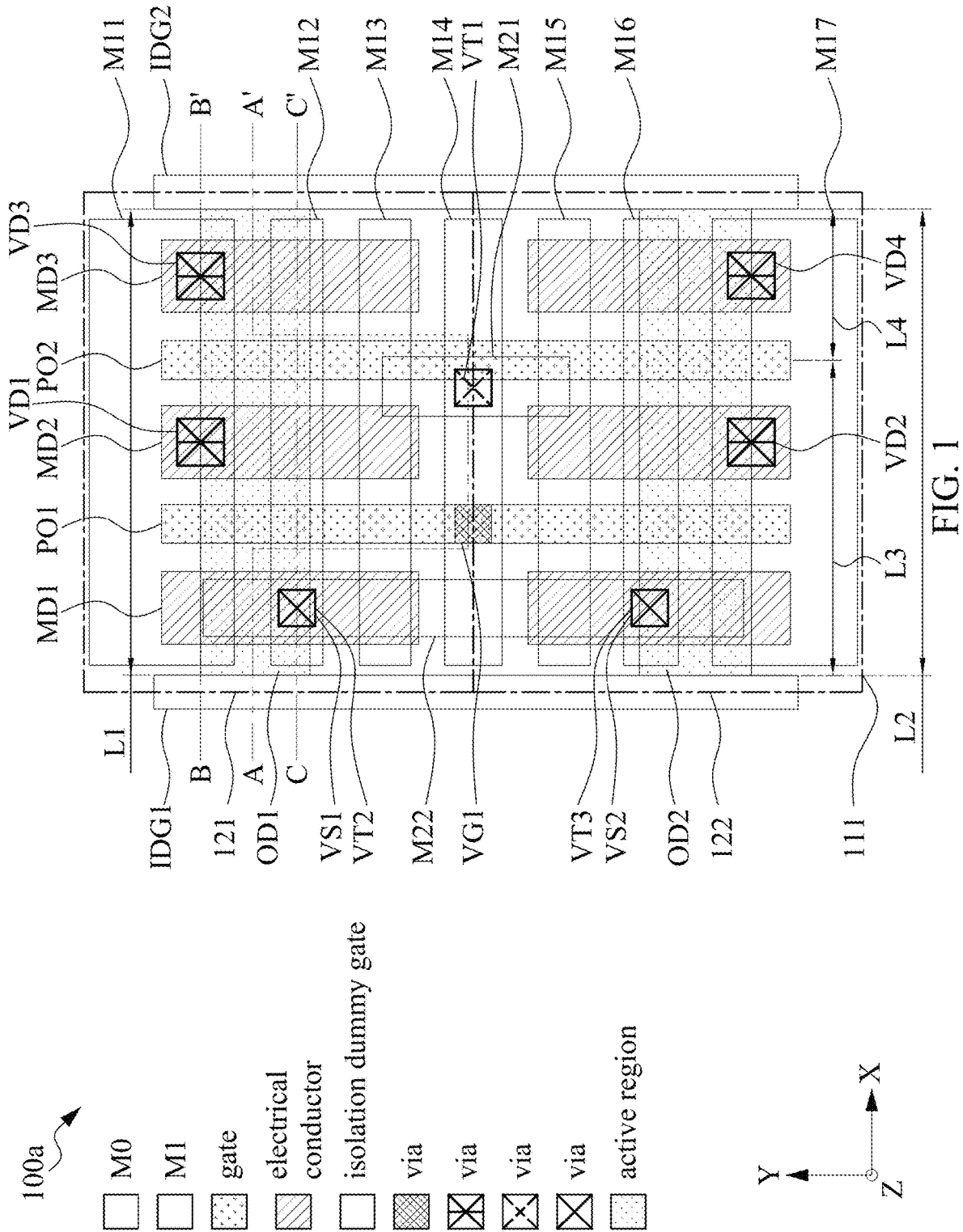
FIG. 1 illustrates a schematic view of a layout of a semiconductor device, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below." "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless otherwise specified.

In some embodiments, cells in a layout diagram (or, alternatively, counterpart cell regions in a corresponding semiconductor device) are isolated from each other by an isolation dummy gate. In some embodiments, an isolation dummy gate which separates first and second portions of an active region within a first cell of a layout diagram (or, alternatively, counterpart first and second cell regions) is referred to as an internal isolation dummy gate whereas each one or more isolation dummy gates which isolate the first cell (alternatively, the counterpart first cell region) from a second cell of the layout diagram (alternatively, a counterpart second cell region in the corresponding semiconductor device) is referred to as an external isolation dummy gate. The isolation dummy gate cuts an active region, causing the aforesaid active region to be discontinuous. The length of an active region affects the mobility of carriers (e.g., hole or electron), resultantly affecting the performance of a semiconductor device. For example, P-type field-effect transistor (FET) tends to have a relatively long active region. Various embodiments of the present disclosure provide layout diagrams (and corresponding semiconductor devices based thereon) that selectively adjust the length of the active regions in either P-type FET and/or N-type FET active regions to improve the performance of the semiconductor device.

FIG. 1 illustrates a schematic view of a layout of a semiconductor device 100a, in accordance with some embodiments of the present disclosure. In some embodiments, the semiconductor device 100a is applicable to, for example, a planar FET, a Fin Field-Effect Transistor (FinFET), a nanosheet FET, or other suitable FETs.

For simplicity of disclosure, semiconductor device 100a is represented by a layout diagram. The layout diagram of FIG. 1 is representative of semiconductor device 100a; as a practical matter, semiconductor device 100a is fabricated according to the layout diagram of FIG. 1. In terms of nomenclature, elements in semiconductor device 100a are represented by patterns (also known as shapes) in the layout diagram of FIG. 1. For simplicity of discussion, most elements in the layout diagram of FIG. 1 (and in other layout diagrams disclosed herein) are referred to as if they are counterpart structures rather than patterns/shapes per se. For example, element PO1 in FIG. 1 is a pattern that represents a gate of a transistor in semiconductor device 100a but is referred to as counterpart gate PO1 rather than as gate pattern PO1. Nevertheless, not all of the elements of semiconductor device 100a are explicitly discussed herein in terms of semiconductor-device-phraseology. For example, cell region 111 in semiconductor device 100a is referred to as cell 111, the abbreviation (cell instead of cell region) reflecting the use of layout-diagram phraseology for element 111. Regarding other layout diagrams disclosed herein which are used to represent corresponding semiconductor devices, a nomenclature similar to FIG. 1 is followed.

In some embodiments, the semiconductor device 100a includes at least one cell 111. The cell 111 is a predesigned IC structure to be repeatedly used in individual IC designs. Effective IC design layouts include various predesigned cell 111 and predefined rules of placing the cell 111 for enhanced circuit performance and reduced circuit areas. The cell 111 is repeatedly used in integrated circuit designs and therefore predesigned according to manufacturing technologies and saved in a standard cell library. IC designers retrieve the cell 111 from the standard cell library, incorporate it into their IC designs, and place it into the IC layout according to the predefined placing rules. The cell 111 includes various basic circuit devices, such as an inverter, AND, NAND, OR, XOR, and NOR, which are popular in digital circuit designs for applications, such as central processing unit (CPU), graphic processing unit (GPU), and system on chip (SOC) chip designs. The cell 111 includes other frequently used circuit blocks, such flip-flop circuit and latch.

In some embodiments, the cell 111 includes transistors 121 and 122. The transistors 121 and 122 are arranged along the Y direction. In some embodiments, the transistor 121 is a P-type FET (PFET), which is disposed on an N well region, and the transistor 122 is an N-type FET (NFET), which is disposed on a P well region. In the present embodiment, the transistors 121 and 122 are integrated to form a functional circuit block, such as a complimentary FET (CFET).

In some embodiments, the semiconductor device 100a includes active regions OD1 and OD2, gates PO1 and PO2, electrical conductors MD1, MD2 and MD3, isolation dummy gates IDG1 and IDG2, metal features M11, M12, M13, M14, M15, M16, and M17, as well as metal features M21 and M22. It should be noted that the terms "comprise" or "comprising," "include" or "including," "have" or "having," and the like used in this application are to be understood to be open-ended, i.e., to mean: including, but not limited to. Accordingly, various elements and/or structures, which are not shown in FIG. 1 and formed in the semiconductor device 100a, are within the contemplated scope of the present disclosure.

In some embodiments, each of the isolation dummy gates IDG1 and IDG2 are disposed on a cell edge of the cell 111 to electrically isolate the cell 111 from other cells. An isolation dummy gate is a dielectric structure that includes one or more dielectric materials and functions as an electrical isolation structure. Accordingly, an isolation dummy gate is not a structure that is electrically conductive and thus does not function, e.g., as an active gate of a transistor. An isolation dummy gate includes one or more dielectric materials and functions as an electrical isolation structure. In some embodiments, an isolation dummy gate is based on a gate structure as a precursor. In some embodiments, a dummy gate structure includes a gate conductor, a gate-insulator layer, (optionally) one or more spacers, or the like. In some embodiments, an isolation dummy gate is formed by first forming a gate structure, e.g., a dummy gate structure, sacrificing/removing (e.g., etching) the gate conductor of the gate structure to form a trench, (optionally) removing a portion of a substrate that previously had been under the gate conductor to deepen the trench, and then filling the trench with one or more dielectric materials such that the physical dimensions of the resultant electrical isolation structure, i.e., the isolation dummy gate, are similar to the dimensions of the dummy gate conductor which was sacrificed, namely the gate conductor or the combination of the gate conductor and the portion of the substrate. In some embodiments, each of the isolation dummy gates IDG1 and IDG2 is a dielectric feature that includes one or more dielectric materials (e.g., oxide, nitride, oxynitride, or other suitable materials), and functions as an isolation feature. The isolation dummy gates IDG1 and IDG2 extend along the Y direction. In some embodiments, each of the isolation dummy gates IDG1 and IDG2 is a continuous polysilicon on oxide diffusion (OD) edge structure, and is referred to as a CPODE structure.

In some embodiments, each of the isolation dummy gates IDG1 and IDG2 cuts or disconnects an active region such that the active regions which are disposed on two opposite sides of the isolation dummy gate can be regarded as discontinuous or separated from each other. In some embodiments, each of the isolation dummy gates IDG1 and IDG2 is formed by cutting a doped region of a substrate and replacing the cut portion with dielectric material(s). In some embodiments which implement FinFET technology, each of the isolation dummy gates IDG1 and IDG2 is formed by cutting a portion of a fin structure and replacing the cut portion with dielectric material(s).

The gates PO1 and PO2 extend along the Y direction. The gates PO1 and PO2 are spaced apart from each other. The gates PO1 and PO2 are disposed within the cell edge of the cell 111 and between the isolation dummy gates IDG1 and IDG2. In some embodiments, each of the gates PO1 and PO2 extends across the active regions OD1 and OD2.

Each of the gates PO1 and PO2 includes a gate dielectric layer (not shown) and a gate electrode layer (not shown) disposed on the gate dielectric layer. The gate dielectric layer includes silicon oxide ($SiO_x$), silicon nitride ($Si_xN_y$), silicon oxynitride (SiON), or a combination thereof. The gate dielectric layer includes dielectric material(s), such as high-k dielectric material. The high-k dielectric material has a dielectric constant (k value) greater than 4. The high-k material includes hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another applicable material. Other suitable materials are within the contemplated scope of the disclosure.

The gate electrode layer is made of conductive material, such as aluminum (Al), copper (Cu), tungsten (W), titanium (Ti), tantalum (Ta), or other applicable materials. In some embodiments, the gate electrode layer includes a work function layer. The work function layer is made of metal material, and the metal material includes N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal includes titanium nitride (TiN), tungsten nitride (WN), tantalum nitride (TaN), ruthenium (Ru) or a combination thereof. Other suitable materials are within the contemplated scope of the disclosure.

The electrical conductors MD1, MD2, and MD3 extend along the Y direction. Each of the electrical conductors MD1, MD2, and MD3 is configured to electrically connect a source/drain feature to a metal feature (e.g., the metal features M11-M17). The electrical conductors MD1, MD2, and MD3 are disposed within the cell edge of the cell 111 and between the isolation dummy gates IDG1 and IDG2. The electrical conductors MD1, MD2, and MD3 are spaced apart from each other. The electrical conductor MD1 is disposed between the isolation dummy gate IDG1 and the gate PO1, the electrical conductor MD2 is disposed between the gates PO1 and PO2, and the electrical conductor MD3 is disposed between the gate PO2 and the isolation dummy gate IDG2. In some embodiments, each of the electrical conductors MD1, MD2, and MD3 has two separated segments, one of which is disposed within the transistor 121, the other of which is disposed within the transistor 122.

The active regions OD1 and OD2 extend along the X direction. In some embodiments, each of the active regions OD1 and OD2 is a region with a semiconductor surface wherein various doped features are formed and configured to one or more device, such as a diode, a transistor, and/or other suitable devices. The active regions OD1 and OD2 are spaced apart from each other. The active region OD1 is disposed within the transistor 121, while the active region OD2 is disposed within the transistor 122. In some embodiments, each of the active regions OD1 and OD2 is a continuous active region. In some embodiments, the active region OD1 extends continuously between the isolation dummy gates IDG1 and IDG2 along the X direction. In some embodiments, the active region OD1 terminates at the right side of the isolation dummy gate IDG1 and at the left side of the isolation dummy gate IDG2 and has a length L1. In some embodiments, the active region OD2 extends continuously between the isolation dummy gates IDG1 and IDG2 along the X direction. In some embodiments, the active region OD2 terminates at the right side of the isolation dummy gate IDG1 and at the left side of the isolation dummy gate IDG2 and has a length L2. In some embodiments. L1 is substantially equal to L2. In some embodiments, the term "active region" discussed in the present disclosure may also be referred to as an oxide dimensioned area.

In FIG. 1, the right side of cell 111 extends in the Y direction and is collinear with a long axis of isolation dummy gate IDG2. In FIG. 1, relative to the X direction, rightmost ends of the active regions OD1 and OD2 terminate at the left side of the isolation dummy gate IDG2 (as noted above), where the left side of isolation dummy date IDG2 aligns with a first imaginary reference line (not shown), the first imaginary reference line extending in the Y-direction. The first imaginary reference line is parallel and proximal to the right side of cell 111. In some embodiments, the right side of cell 111 is collinear with the first imaginary line, where (again) the rightmost ends of active regions OD1 and OD2 are aligned with the first imaginary line. In some embodiments, an isolation dummy gate (not shown in FIG. 1, but see cell 111 of FIG. 6, or the like) is in the interior of cell 111 and separates the active region OD1 into parts which are collinear relative to the X direction. In such embodiments, the rightmost end of the rightmost part of active region OD1 aligns with the first imaginary reference line. Also in such embodiments, the leftmost end of the leftmost part of active region OD1 aligns with the second imaginary reference line.

In FIG. 1, the left side of cell 111 extends in the Y direction and is collinear with a long axis of isolation dummy gate IDG1. In FIG. 1, relative to the X direction, leftmost ends of the active regions OD1 and OD2 terminate at the right side of the isolation dummy gate IDG1 (as noted above), where the right side of isolation dummy date IDG1 aligns with a second imaginary reference line (not shown), the second imaginary reference line extending in the Y-direction. The second imaginary reference line is parallel and proximal to the left side of cell 111. In some embodiments, the left side of cell 111 is collinear with the second imaginary line, where (again) the leftmost ends of active regions OD1 and OD2 are aligned with the second imaginary line. In some embodiments, an isolation dummy gate (not shown in FIG. 1, but see cell 111 of FIG. 6, or the like) is in the interior of cell 111 and separates the active region OD2 into parts which are collinear relative to the X direction. In such embodiments, the rightmost end of the rightmost part of active region OD2 aligns with the first imaginary reference line. Also in such embodiments, the leftmost end of the leftmost part of active region OD2 aligns with the second imaginary reference line.

In some embodiments, as shown in FIG. 1, the metal features M11-M17 extend along the X direction and are spaced apart from each other. Each of the metal features M11-M17 overlaps the gates PO1 and PO2 along the Z direction. The metal features M11-M13 overlap the electrical conductors MD1-MD3 along the Z direction and be disposed within the transistor 121. The metal features M15-M17 overlap the electrical conductors MD1-MD3 along the Z direction and be disposed within the transistor 122. The metal feature M14 is free from overlapping each of the electrical conductors MD1-MD3, and is disposed on the boundary of the transistors 121 and 122. The metal features M11-M17 are disposed at a first horizontal level. In some embodiments, each of the metal features M11-M17 discussed in the present disclosure is also referred to as a zero metal layer (M0). The terms "overlap" and "overlapping" in this disclosure are used to describe two elements and/or features being at least partially vertically, or along the Z direction, aligned to each other.

The metal features M21 and M22 extend along the Y direction. The metal features M21 and M22 are disposed above the metal features M11-M17 and at a second horizontal level higher than the first horizontal level. The metal feature M21 overlap the metal feature M14 along the Z direction. The metal feature M22 is disposed above and overlaps the electrical conductor MD1 along the Z direction. The metal feature M22 extends across the transistors 121 and 122. In some embodiments, each of the metal features M21 and M22 discussed in the present disclosure are also referred to as a first metal layer (M1).

Figure 1A:
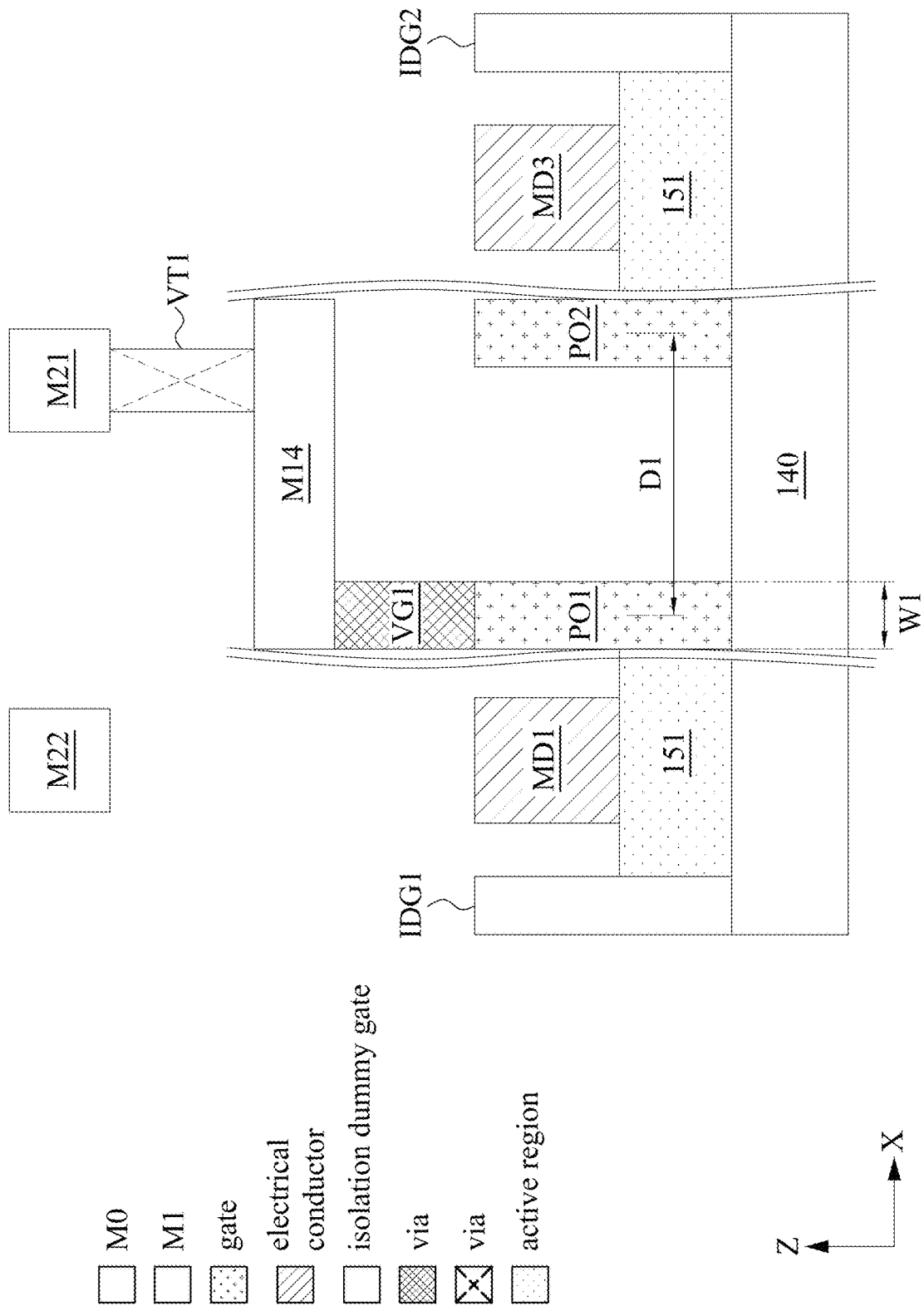
FIG. 1A illustrates a cross-sectional view of a semiconductor device, in accordance with some embodiments of the present disclosure.

Referring to FIG. 1A, FIG. 1A illustrates a cross-sectional view along the line A-A' shown in FIG. 1. It should be noted that FIG. 1A only illustrates the cross-section along the X direction, and the part along the Y direction is omitted for brevity. As shown in FIG. 1A, the semiconductor device 100a includes a substrate 140, a source/drain (S/D) feature 151, a via VG1, and a via VT1.

In some embodiments, the substrate 140 is a semiconductor substrate, such as a bulk semiconductor, a semiconductor-on-insulator (SOI) substrate, or the like, which is doped (e.g., with a P-type or an N-type dopant) or undoped. In some embodiments, the substrate 140 is a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 140 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The gates PO1 and PO2 are disposed over the substrate 140. As shown in FIG. 1A, the gate PO1 has a width W1, and the gates PO1 and PO2 have a pitch D1 therebetween. In some embodiments, the ratio between W1 and D1 ranges, but is not limited to, from about 0.01 to about 0.4.

The S/D feature 151 is disposed on the substrate 140. In some embodiments, the S/D feature 151 includes a doped region configured for a P-type FET, and include p-type dopants, such as boron, $BF_2^+$, and/or a combination thereof. In alternative embodiments, the S/D feature 151 includes a doped region configured for an N-type FET, and include n-type dopants, such as phosphorus, arsenic, and/or a combination thereof. As shown in FIG. 1A, the S/D feature 151 is cut by the isolation dummy gates IDG1 and IDG2. The electrical conductors MD1 and MD3 are disposed on the S/D feature 151. In some embodiments, the active region is, for example, a region of the substrate above which source/drain features and gates are disposed.

The via VG1 is disposed between the gate PO1 and the M1 (e.g., the metal feature M14). The via VT1 is disposed between the M1 (e.g., the metal feature M14) and the M2 (e.g., the metal feature M21). In some embodiments, the gate PO1 is electrically connected to the metal feature M21 through the via VG1, metal feature M14, and via VT1. In some embodiments, the gate PO2 is a floating gate or free from being electrically connected to a supply voltage.

Figure 1B:
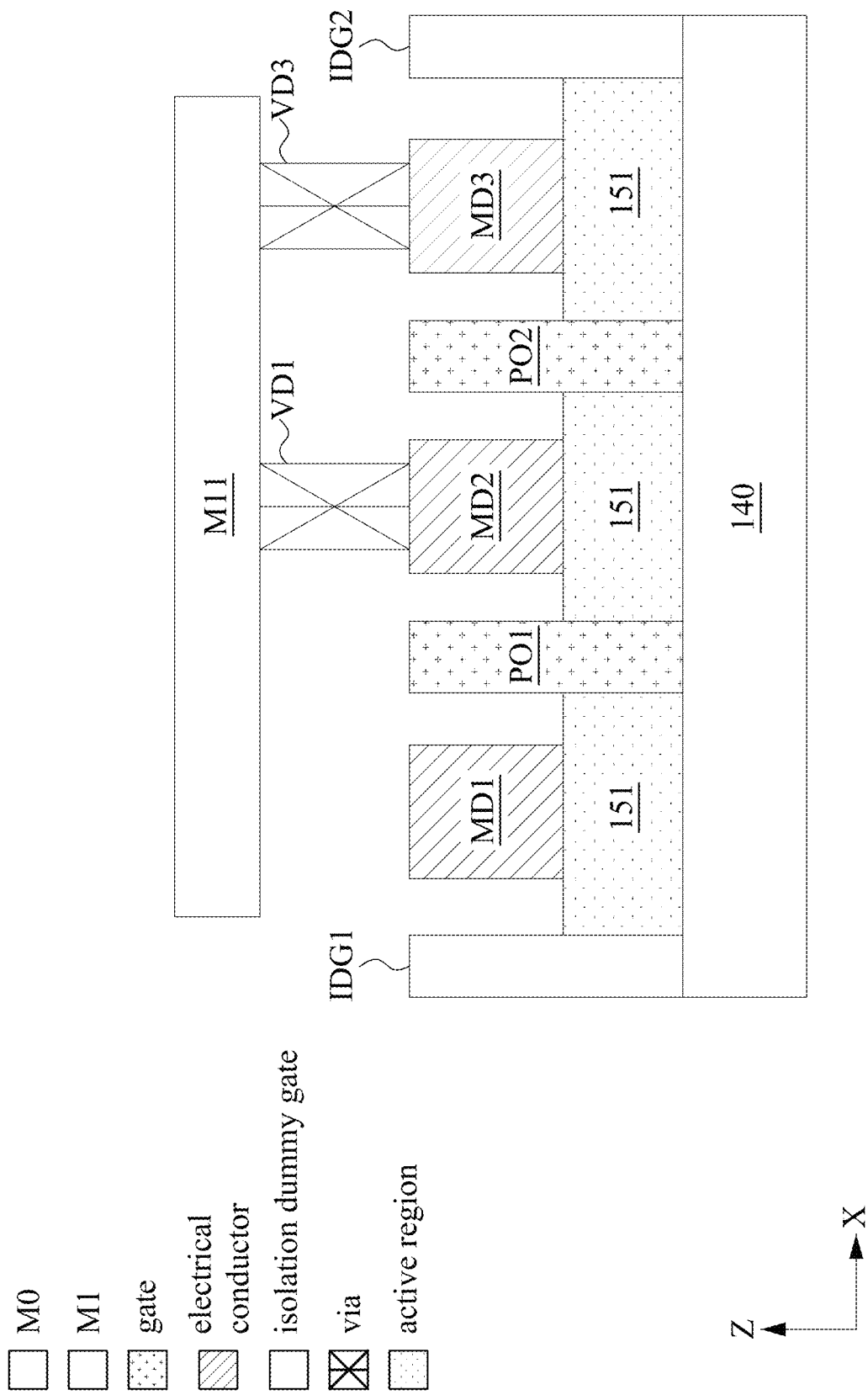
FIG. 1B illustrates a cross-sectional view of a semiconductor device, in accordance with some embodiments of the present disclosure.

Referring to FIG. 1B, FIG. 1B illustrates a cross-sectional view along the line B-B' shown in FIG. 1. As shown in FIG. 1B, the semiconductor device 100a includes vias VD1 and VD3. The electrical conductor MD2 is electrically connected to the metal feature M11 through the via VD1, and the electrical conductor MD3 is electrically connected to the metal feature M11 through the via VD3. In some embodiments, the electrical conductor MD2 is electrically connected to the electrical conductor MD3 through the vias VD1, VD2 and metal feature M11.

Figure 1C:
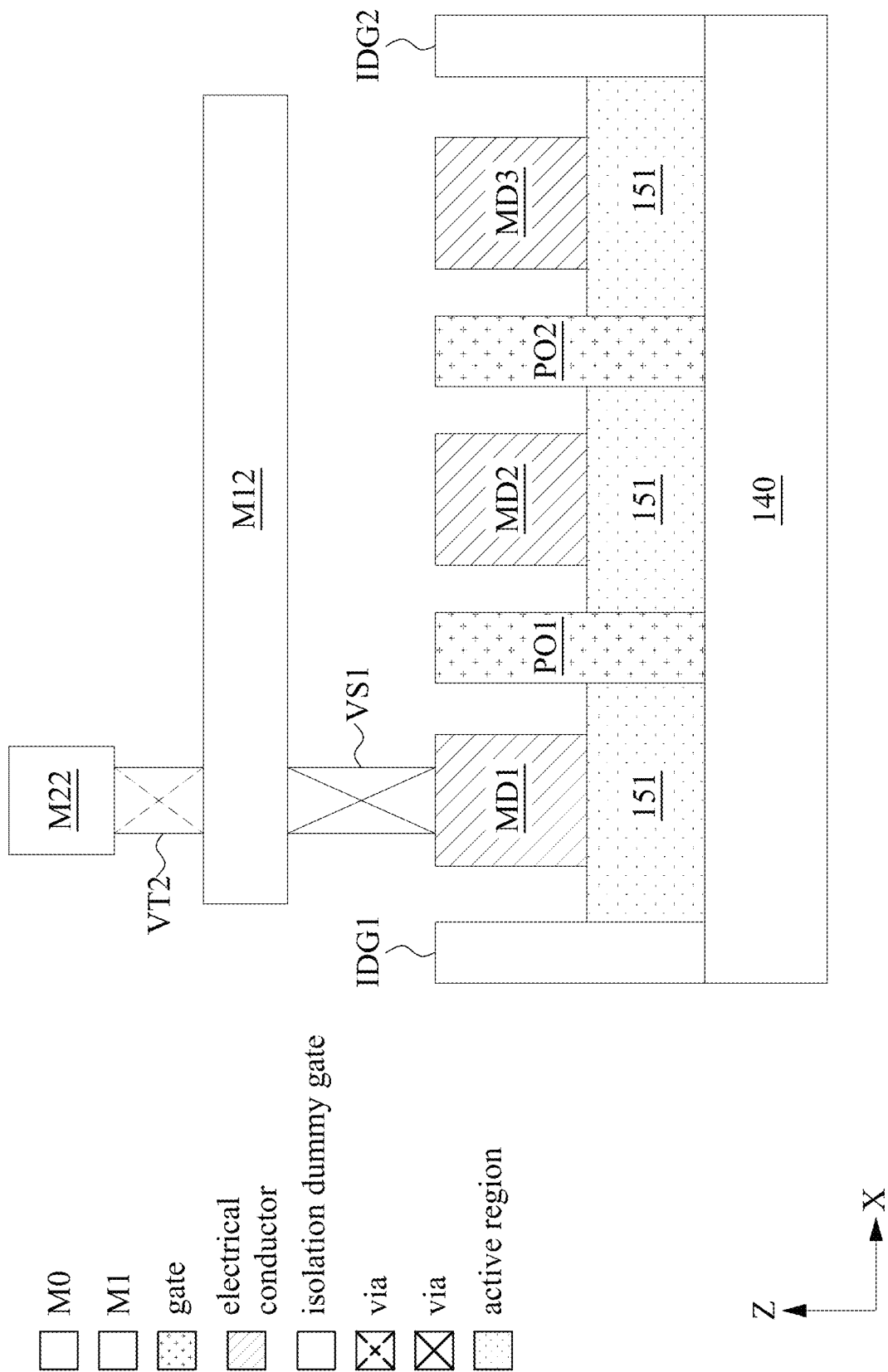
FIG. 1C illustrates a cross-sectional view of a semiconductor device, in accordance with some embodiments of the present disclosure.

Referring to FIG. 1C, FIG. 1C illustrates a cross-sectional view along the line C-C' shown in FIG. 1. As shown in FIG. 1C, the semiconductor device 100a includes vias VS1 and VT2. In some embodiments, the via VT2 overlaps the via VS1 along the Z direction. The electrical conductor MD1 is electrically connected to the metal feature M12 through the via VS1. The metal feature M12 is electrically connected to the metal feature M22 through the via VT2.

Although only the elements and their positional relation in the transistor 121 are illustrated in the cross-sectional views of FIGS. 1A, 1B, and 1C, it should be noted that the positional relation or electrical relation in the transistor 122 can be obtained based on the layout shown in FIG. 1. For example, as shown in FIG. 1, the semiconductor device 100a includes vias VD2 and VD4. Each of the vias VD2 and VD4 is electrically connected to the metal feature M17. In the transistor 122, the electrical conductor MD2 is electrically connected to the electrical conductor MD3 through the vias VD2 and VD4 and the metal feature M17. Further, as shown in FIG. 1, the metal feature M22 electrically connects vias VT2 and VT3. The via VT3 overlaps and is electrically connected to the via VS2 along the Z direction. The via VT3 is electrically connected to the MD1 in the transistor 122 through the metal feature M16 and via VS2.

In some embodiments, the vias VS1, VG1, and VD1 are electrically connected to different supply voltages. In some embodiments, the electrical conductor MD1, the gate PO1, and the electrical conductor MD2 is electrically connected to different supply voltages. For example, one of the electrical conductors MD1 and MD2 is electrically connected to a power supply voltage, and the other one is electrically connected to ground. As shown in FIGS. 1 and 1B, the electrical conductors MD2 and MD3 are electrically connected to the same supply voltage. Therefore, the electrical conductor MD3 and the gate PO2, which is disposed between the electrical conductors MD2 and MD3, can serve as a dummy MOS. The active region can extend continuously across such dummy MOS. Therefore, the active region is prolonged. The length of an active region can affect the mobility of carriers, such as holes or electrons. Further, the mobility of the carriers can influence the performance of the MOS.

In some embodiments, the length L1 of the active region OD1 is a sum of a functional length L3 (e.g., a distance between the isolation dummy gate IDG1 and gate PO2) and a dummy length L4 (e.g., a distance between the gate PO2 and isolation dummy gate IDG2). The gate PO2 and electrical conductors MD3 assist in increasing the length of the active region OD1 from L3 to L1. In some embodiments, the ratio between L4 and L3 ranges from about 0.01 to about 20, such as 0.01, 0.33, 0.5, 1, 1.33, 1.5, 2, 5, 10 or 20. That is, L4 is less than, equal to, or greater than L3 based on a desired electrical property of the semiconductor device 100a. When the ratio between L4 and L3 ranges from about 0.01 to about 20, mobility of the carriers can be adjusted to be more effective. Therefore, the performance of semiconductor device 100a can be enhanced.

Figure 2:
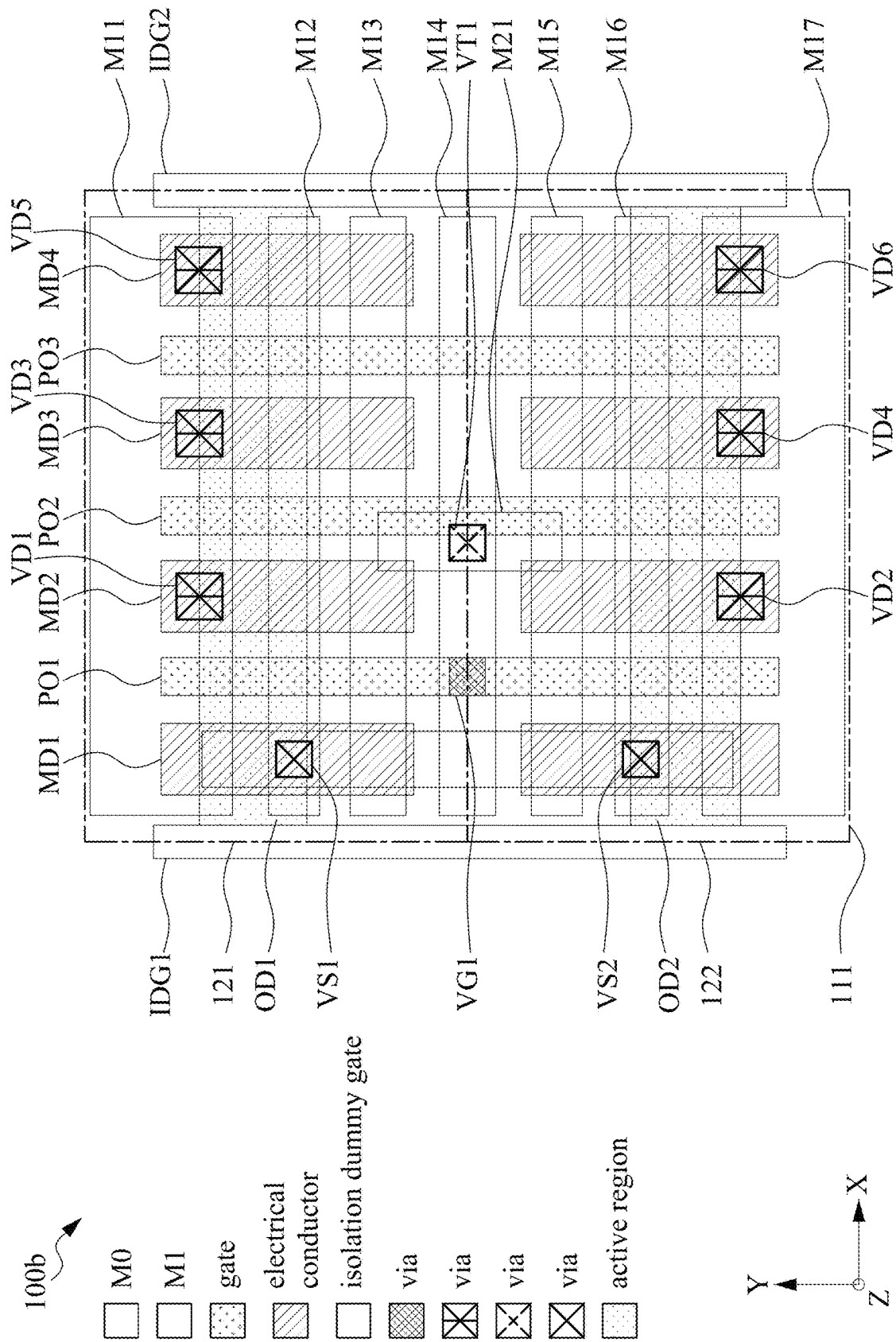
FIG. 2 illustrates a schematic view of a layout of a semiconductor device, in accordance with some embodiments of the present disclosure.

FIG. 2 illustrates a schematic view of a layout of a semiconductor device 100b, in accordance with some embodiments of the present disclosure. The semiconductor device 100b is similar to the semiconductor device 100a, except that the semiconductor device 100b further includes a gate PO3, an electrical conductor MD4, as well as vias VD5 and VD6.

In some embodiments, the gate PO3 and the electrical conductor MD4 has structures similar to or the same as those of the gate PO2 and electrical conductor MD3, respectively. The via VD5 electrically connects the electrical conductor MD4 and the metal feature M11. In some embodiments, in the transistor 121, the electrical conductors MD2, MD3, MD4 are electrically connected to each other. The via VD6 electrically connects the electrical conductor MD4 and the metal feature M17. In some embodiments, in the transistor 122, the electrical conductors MD2, MD3, MD4 are electrically connected to each other. In this embodiment, the gates PO2 and PO3 as well as electrical conductors MD3 and MD4 can serve as a dummy MOS, which is configured to prolong the length of an active region within a cell, allowing the active region to extend continuously with a longer length. As a result, the performance of semiconductor device 100b can be enhanced.

Figure 3:
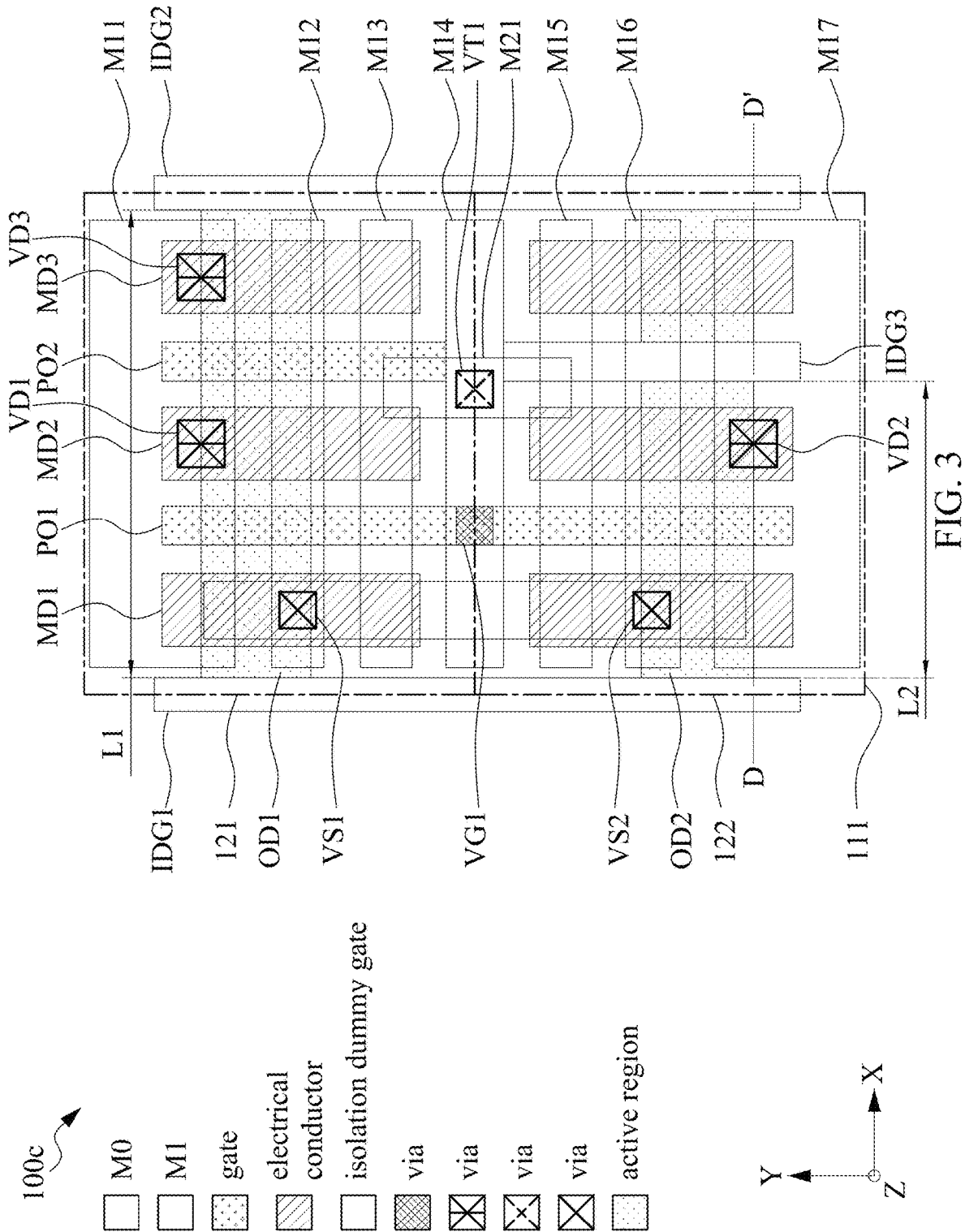
FIG. 3 illustrates a schematic view of a layout of a semiconductor device, in accordance with some embodiments of the present disclosure.
Figure 3A:
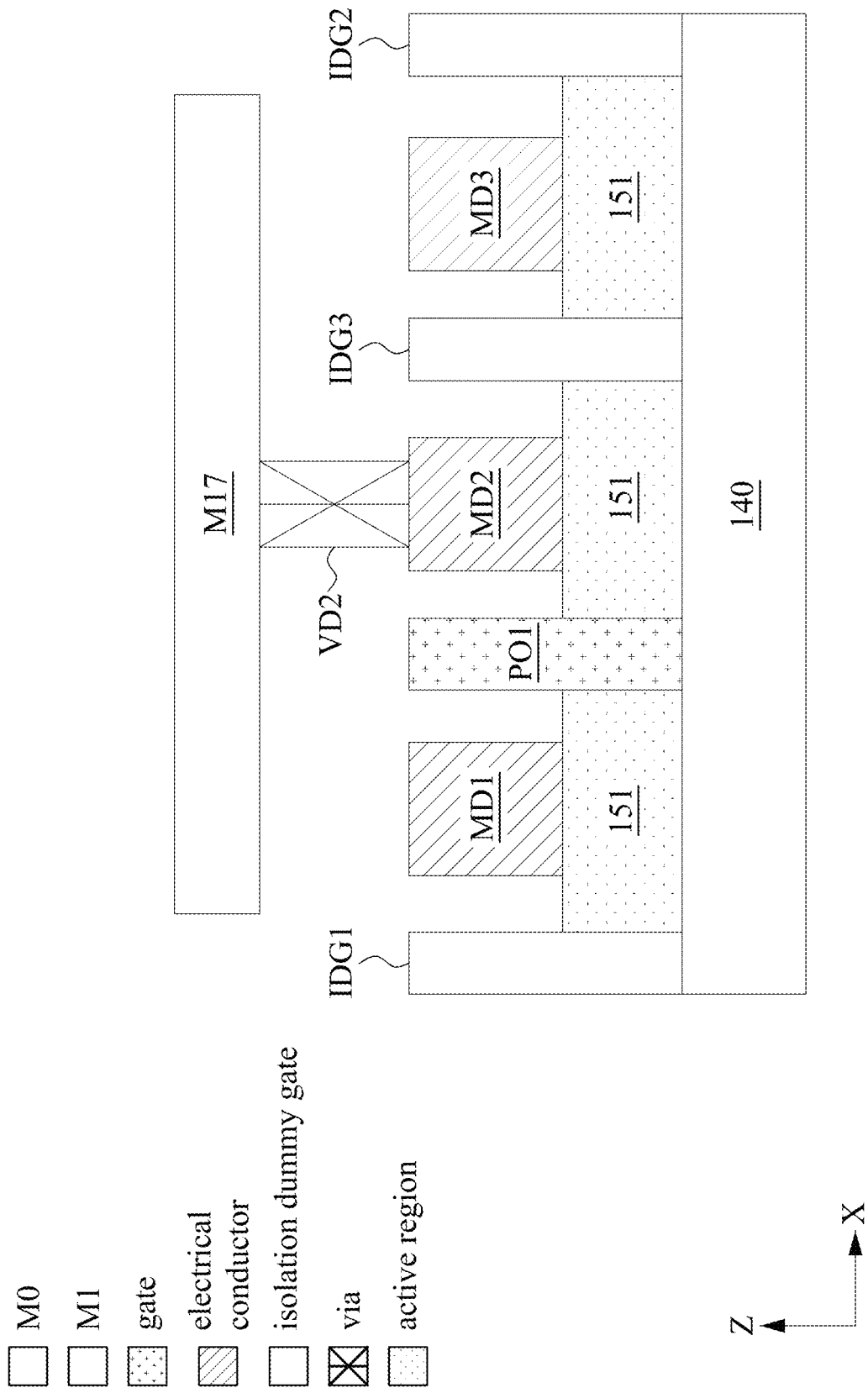
FIG. 3A illustrates a cross-sectional view of a semiconductor device, in accordance with some embodiments of the present disclosure.

FIG. 3 illustrates a schematic view of a layout of a semiconductor device 100c, in accordance with some embodiments of the present disclosure, and FIG. 3A illustrates a cross-sectional view along line D-D' of the semiconductor device 100c. The semiconductor device 100c can be similar to the semiconductor device 100a, except that the semiconductor device 100c further includes an isolation dummy gate IDG3 disposed in the transistor 122.

In some embodiments, the isolation dummy gate IDG3 is disposed within the cell edge of the cell 111. The isolation dummy gate IDG3 extends along the Y direction and is disposed between the isolation dummy gates IDG1 and IDG2. In some embodiments, the isolation dummy gate IDG3 is disposed between the electrical conductors MD2 and MD3. In some embodiments, the isolation dummy gate IDG3 is aligned to the gate PO2 along the Y direction. As shown in FIG. 3A, the isolation dummy gate IDG3 cuts the S/D feature 151, and divides the active region in the transistor 122 into two separate segments. Further, in the transistor 122, the electrical conductor MD3 is electrically isolated from the electrical conductor MD2. Referring back to FIG. 3, the active region OD2 continuously extends between the isolation dummy gates IDG1 and IDG3, and terminates at the right side of the isolation dummy gate IDG1 and at the left side of the isolation dummy gate IDG3. In some embodiments, the length L2 of the active region OD2 is different from the length L1 of the active region OD1. In some embodiments, L2 is less than L1. In some embodiments, the ratio of L2 and L1 ranges from about 0.05 to about 0.99. When the ratio between L2 and L1 ranges from about 0.05 to about 0.99, the electrical property of the semiconductor device 100c can be enhanced. Although FIG. 3 illustrates that the isolation dummy gate IDG3 is disposed in the transistor 122 such that L2 is less than L1, in some other embodiments, the isolation dummy gate IDG3 is disposed in the transistor 121 such that L1 is less than L2.

In some embodiments, the transistors 121 and 122 tend to have different lengths of the active regions because electrons and holes have different characteristics while increasing the length of an active region. For example, the P-type FET tends to have an active region with a relatively great length, and the N-type FET tends to have an active region with a relatively short length. In the embodiment shown in FIG. 3, only the active region OD1 in the transistor 121 is prolonged, which can assist in improving the performance of the semiconductor device 100c.

Figure 4:
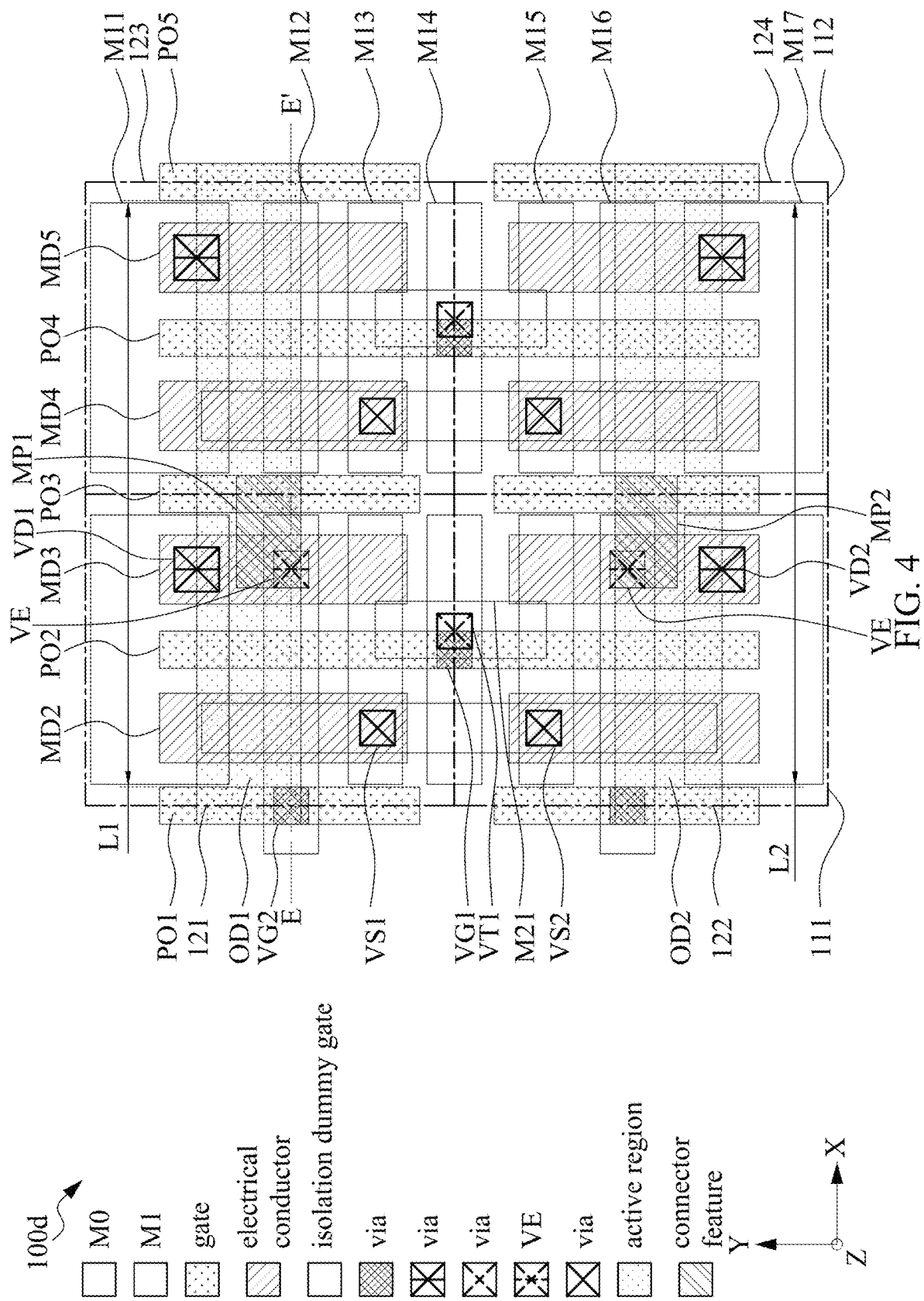
FIG. 4 illustrates a schematic view of a layout of a semiconductor device, in accordance with some embodiments of the present disclosure.
Figure 4A:
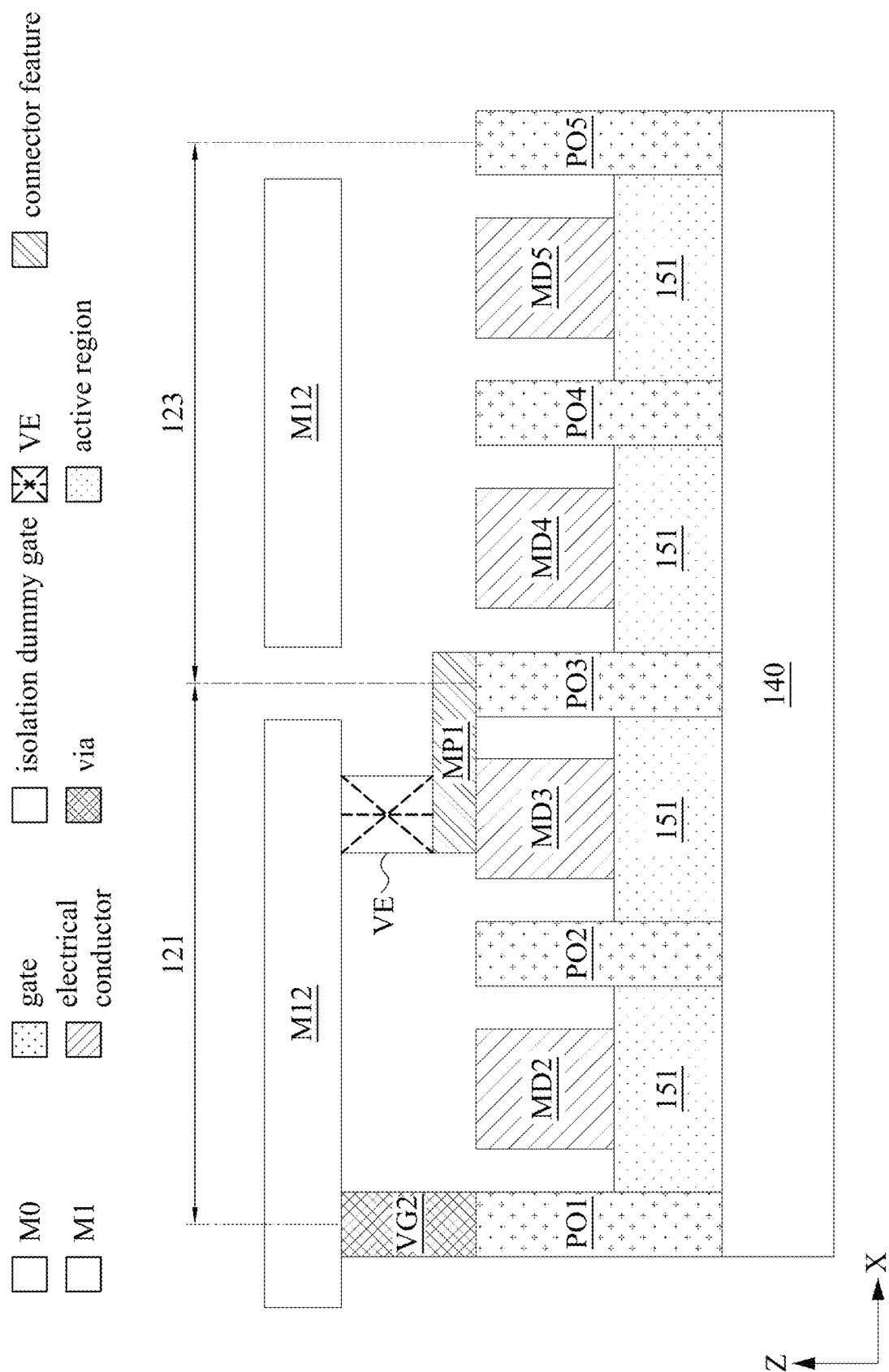
FIG. 4A illustrates a cross-sectional view of a semiconductor device, in accordance with some embodiments of the present disclosure.

FIG. 4 illustrates a schematic view of a layout of a semiconductor device 100d, in accordance with some embodiments of the present disclosure, and FIG. 4A illustrates a cross-sectional view along line E-E' of the semiconductor device 100d. The semiconductor device 100d can be similar to the semiconductor device 100a, except that the semiconductor device 100d further includes a cell 112.

The cell 112 abuts upon the cell 111. The cells 111 and 112 are arranged along the X direction. The cell 112 includes transistors 123 and 124. In some embodiments, the transistor 123 is a P-type FET (PFET), and the transistor 124 is an N-type FET (nFET). In the present embodiment, the transistors 123 and 124 are integrated to form a functional circuit block, such as a complimentary FET. The semiconductor device 100d further includes gates PO4 and PO5 as well as electrical conductors MD4 and MD5. In some embodiments, the gates PO1 and PO3 are disposed on the cell edge of the cell 111. In some embodiments, the gates PO3 and PO5 are disposed on the cell edge of the cell 112. In some embodiments, the gate PO4 is disposed within the cell edge of the cell 112 and between the gates PO3 and PO5. The electrical conductor MD4 is disposed between the gates PO3 and PO4. The electrical conductor MD5 is disposed between the gates PO4 and PO5.

In some embodiments, the semiconductor device 100*d* further includes a connect feature MP1. The connect feature MP1 is disposed in the transistor 121 and configured to electrically connect the gate PO3 and the electrical conductor MD3 to assist in prolonging the length of the active region OD1. As shown in FIG. 4A, the connect feature MP1 is in contact with top surfaces of the gate PO3 and the electrical conductor MD3. Each of the gate PO3 and electrical conductor MD3 is electrically connected to the metal feature M12 through the connect feature MP1 and a via VE disposed over the connect feature MP1. In some embodiments, the gate PO1 is electrically connected to the metal feature M12 through a via VG2. In some embodiments, the gates PO1 and PO3 and the electrical conductor MD3 are electrically connected to the same supply voltage. In some embodiments, as shown in FIG. 4, the metal feature M12 exceeds the cell edge of the transistor 121. In some embodiments, the active region OD1 extends across the transistor 121 and the transistor 123 without being cut by the isolation dummy gate. In some embodiments, the active region OD1 continuously extends at least between the gates PO1 and PO5.

In some embodiments, the semiconductor device 100*d* further includes a connect feature MP2. The connect feature MP2 is disposed in the transistor 122 and configured to electrically connect the gate PO3 and the electrical conductor MD3 to assist in prolonging the length of the active region OD2. In some embodiments, the connect feature MP2 is disposed over and in contact with the top surfaces of the metal feature M16 and the gate PO3. In some embodiments, the active region OD2 extends across the transistors 122 and 124. For example, the active region OD2 continuously extends at least between the gates PO1 and PO5. In this embodiment, the active region can be prolonged and can continuously extend across two abutting cells by forming a connector feature (e.g., the connect feature MP1 or MP2). Thus, the performance of the semiconductor device 100*d* can be improved.

In some other embodiments, the connect feature MP1 in the transistor 121 is disposed above and electrically connected to the metal feature M13 for auto-place and route (APR) flexibility. In this embodiment, the metal feature M13 exceeds the cell edge. Similarly, in some other embodiments, the connect feature MP2 in the transistor 122 is disposed above and electrically connected to the metal feature M15 for APR flexibility. In this embodiment, the metal feature M15 exceeds the cell edge. When multiple cells are abutted by using the connect feature MP1 or MP2, different metal features can be used to be electrically connected to the connect feature to improve the flexibility of the layout design.

Figure 5:
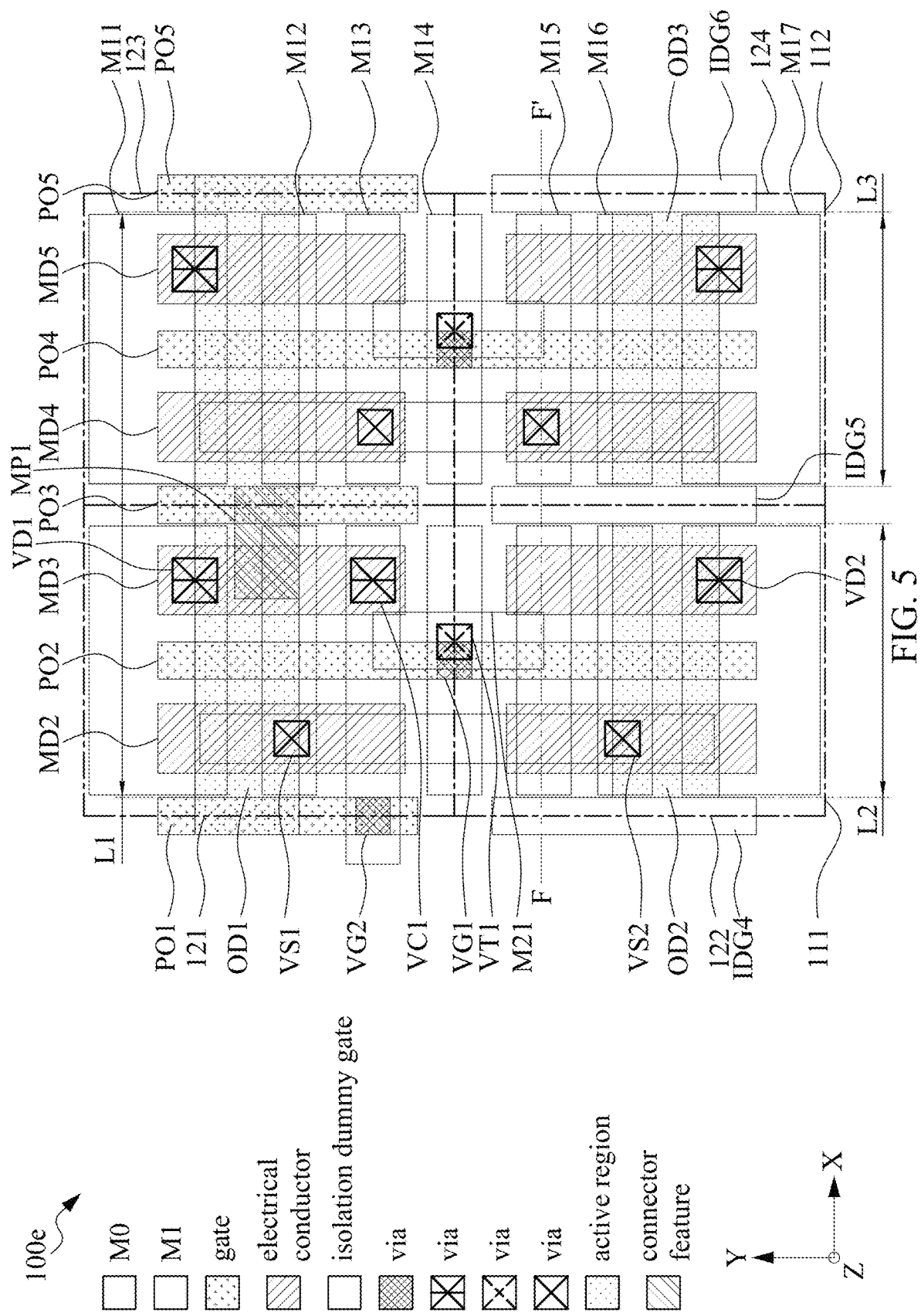
FIG. 5 illustrates a schematic view of a layout of a semiconductor device, in accordance with some embodiments of the present disclosure.

FIG. 5 illustrates a schematic view of a layout of a semiconductor device 100*e*, in accordance with some embodiments of the present disclosure. The semiconductor device 100*e* can be similar to the semiconductor device 100*d*, except that semiconductor device 100*e* further includes isolation dummy gates IDG4, IDG5, and IDG6.

In some embodiments, the isolation dummy gate IDG4 is disposed on the cell edge of the cell 111 and aligned to the gate PO1 along the Y direction. In some embodiments, the isolation dummy gate IDG4 is disposed in the transistor 122. In some embodiments, the isolation dummy gate IDG5 is disposed on the cell boundaries of the cells 111 and 112 and aligned to the gate PO3 along the Y direction. The isolation dummy gate IDG5 is configured to electrically isolate the transistors 122 and 124. In some embodiments, the isolation dummy gate IDG6 is disposed on the cell edge of the cell 112 and aligned to the gate PO5 along the Y direction. In some embodiments, the isolation dummy gate IDG6 is disposed in the transistor 124. The isolation dummy gates IDG4, IDG5, and IDG6 cut the active region of the transistors 122 and 124 into active regions OD2 and OD3.

The active region OD3 is aligned to the active region OD2 in the X direction and disposed within the transistor 124. In some embodiments, the active region OD3 is separated from the active region OD2 by the isolation dummy gate IDG5. In some embodiments, the active region OD2 of the transistor 122 continuously extends between the isolation dummy gates IDG4 and IDG5, while the active region OD3 continuously extends between the isolation dummy gates IDG5 and IDG6.

As shown in FIG. 5, in the transistor 121, the gate PO3 is electrically connected to the electrical conductor MD3 through the connect feature MP1. In some embodiments, the electrical conductor MD3 is electrically connected to the gate PO1 through the metal feature M13, vias VG2 and VC1. The gates PO1, PO3, and electrical conductor MD3 are electrically connected to the same supply voltage. Therefore, the active region OD1 continuously extends across the transistors 121 and 123, while the active region in the transistors 122 and 124 is divided into active regions OD2 and OD3. In some embodiments, the length L2 of the active region OD2 is less than the length L1 of the active region OD1. In some embodiments, the length L3 of the active region OD3 is less than the length L1 of the active region OD1. In some embodiments, the sum of the lengths L2 and L3 is less than the length L1 by a difference of the width of the isolation dummy gate IDG5.

In some embodiments, the P-type FET (e.g., the transistor 121 and transistor 123) and N-type FET (e.g., the transistor 122 and transistor 124) tend to have different lengths of the active region to control the mobility of carriers. In the embodiment shown in FIG. 5, the active region OD1 is prolonged to continuously extend across the transistor 121 and transistor 123, while each of the active regions OD2 and OD3 has a smaller length with respect to the active region OD1. As a result, the performance of the semiconductor device 100*e* can be improved.

In some other embodiments, the isolation dummy gates IDG4, IDG5, and IDG6 are disposed in the transistors 121 and 123. In this embodiment, the active region of the transistors 121 and 123 is divided into two segments, while the active region in the transistors 122 and 124 is prolonged and continuously extends across the transistors 122 and 124.

Figure 6:
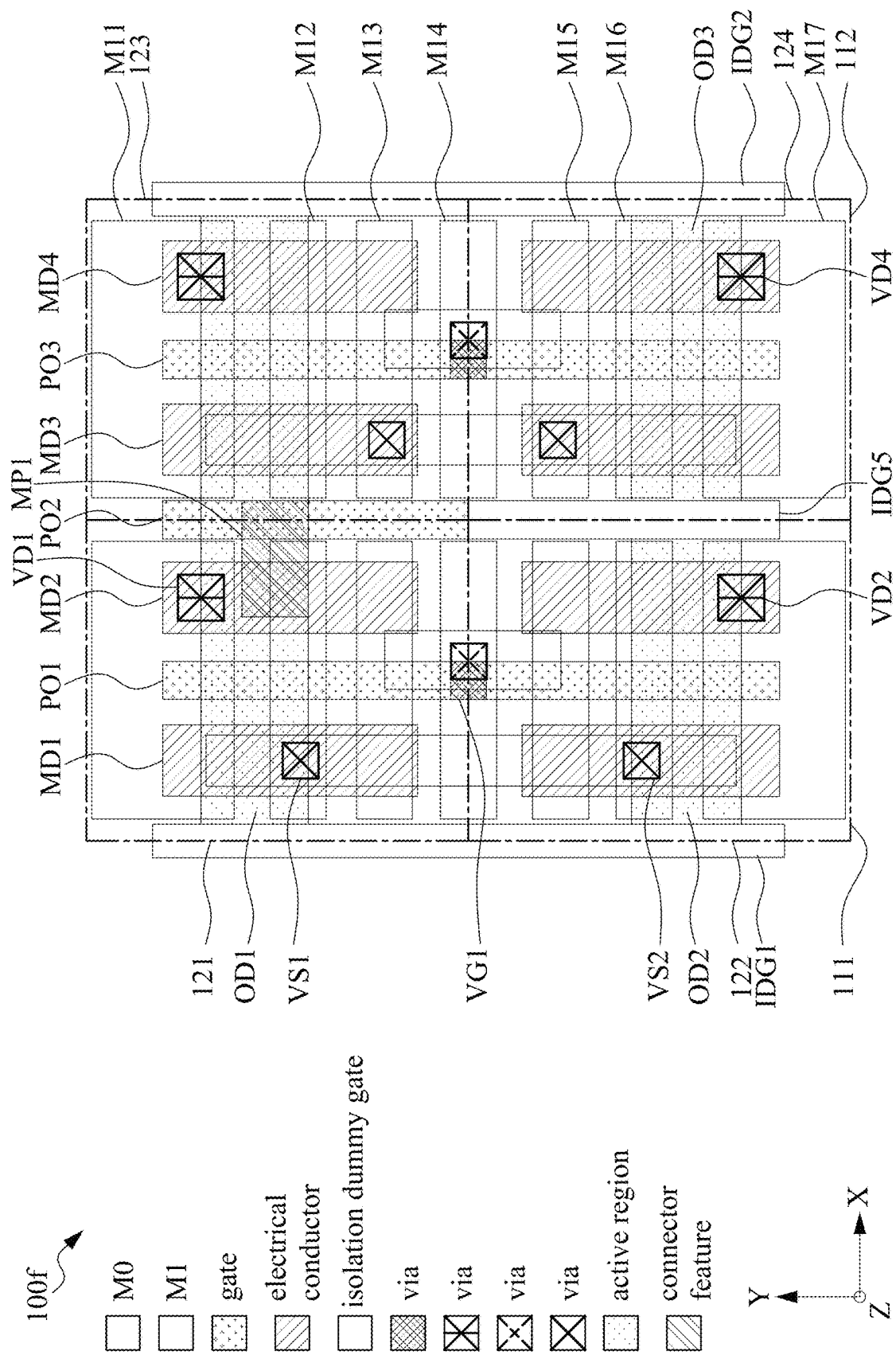
FIG. 6 illustrates a schematic view of a layout of a semiconductor device, in accordance with some embodiments of the present disclosure.

FIG. 6 illustrates a schematic view of a layout of a semiconductor device 100*f*, in accordance with some embodiments of the present disclosure. The semiconductor device 100*f* can be similar to the semiconductor device 100*e*, except that the semiconductor device 100*f* includes isolation dummy gates IDG1 and IDG2.

In some embodiments, the isolation dummy gate IDG1 is disposed on the cell edge of the cell 111, and extends across the transistors 121 and 122. In some embodiments, the isolation dummy gate IDG2 is disposed on the cell edge of the cell 112, and extends across the transistors 123 and 124. The gate PO2 is electrically connected to the electrical conductor MD2 by the connect feature MP1. In this embodiment, the active region OD1 continuously extends between the isolation dummy gates IDG1 and IDG2, and terminates at the right side of the isolation dummy gate IDG1 and at the left side of the isolation dummy gate IDG2.

In some embodiments, the P-type FET (e.g., the transistor 121 and transistor 123) and N-type FET (e.g., the transistor 122 and transistor 124) tend to have different lengths of the active region to control the mobility of carriers. In the embodiment shown in FIG. 6, the active region OD1 is prolonged to continuously extend across the transistor 121 and transistor 123, while each of the active regions OD2 and OD3 has a smaller length with respect to the active region OD1. As a result, the performance of the semiconductor device 100f can be improved.

Figure 7:
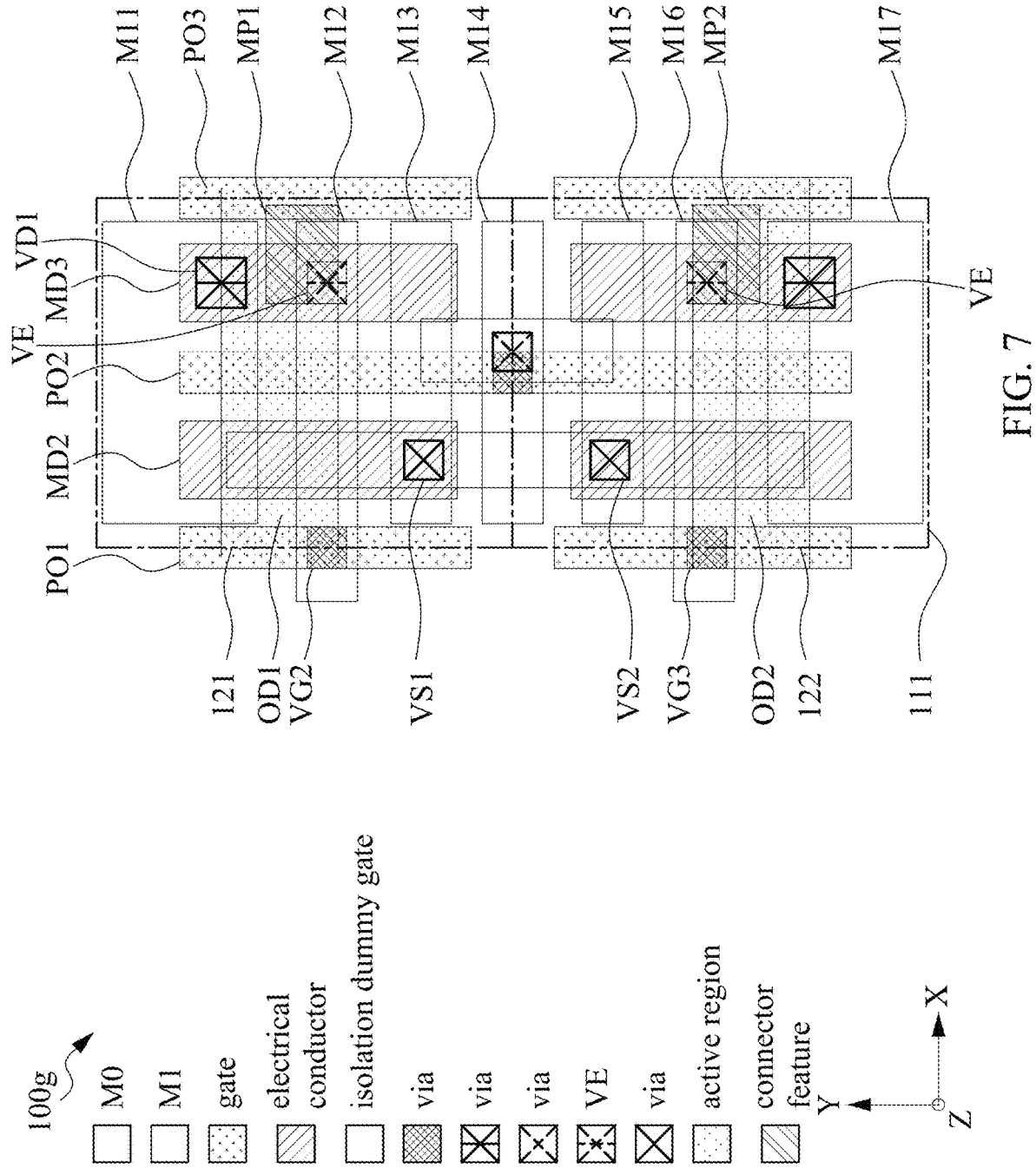
FIG. 7 illustrates a schematic view of a layout of a semiconductor device, in accordance with some embodiments of the present disclosure.

FIG. 7 illustrates a schematic view of a layout of a semiconductor device 100g, in accordance with some embodiments of the present disclosure. It should be noted that the cell 112 is omitted for brevity, and the cell 112 can have a layout similar to or the same as that illustrated in FIG. 5 or 6. The layout of the cell 112 is not intended to be limiting in the present disclosure.

In some embodiments, the gates PO1 and PO3 are disposed on the cell edge of the cell 111. In some embodiments, in the transistor 121, the gate PO3 is electrically connected to the electrical conductor MD3 by the connect feature MP1. In some embodiments, in the transistor 121, the electrical conductor MD3 is electrically connected to the gate PO1 through the metal feature M12, vias VG2 and VE. In this embodiment, in the transistor 121, the gates PO1, PO3, and MD3 are electrically connected to the same supply voltage. In this embodiment, the active region OD1 can continuously extend at least between the gates PO1 and PO3, and can extend to other abutting cells (not shown). Thus, the length of the active region OD1 is prolonged.

In some embodiments, in the transistor 122, the gate PO3 is electrically connected to the electrical conductor MD3 by the connect feature MP2. In some embodiments, in the transistor 122, the electrical conductor MD3 is electrically connected to the gate PO1 by the metal feature M16, vias VG3 and VE. In this embodiment, in the transistor 122, the gates PO1, PO3, and MD3 are electrically connected to the same supply voltage. In this embodiment, the active region OD2 continuously extends at least between the gates PO1 and PO3, and extends to other abutting cells (not shown). Thus, the length of the active region OD2 is prolonged.

Figure 8:
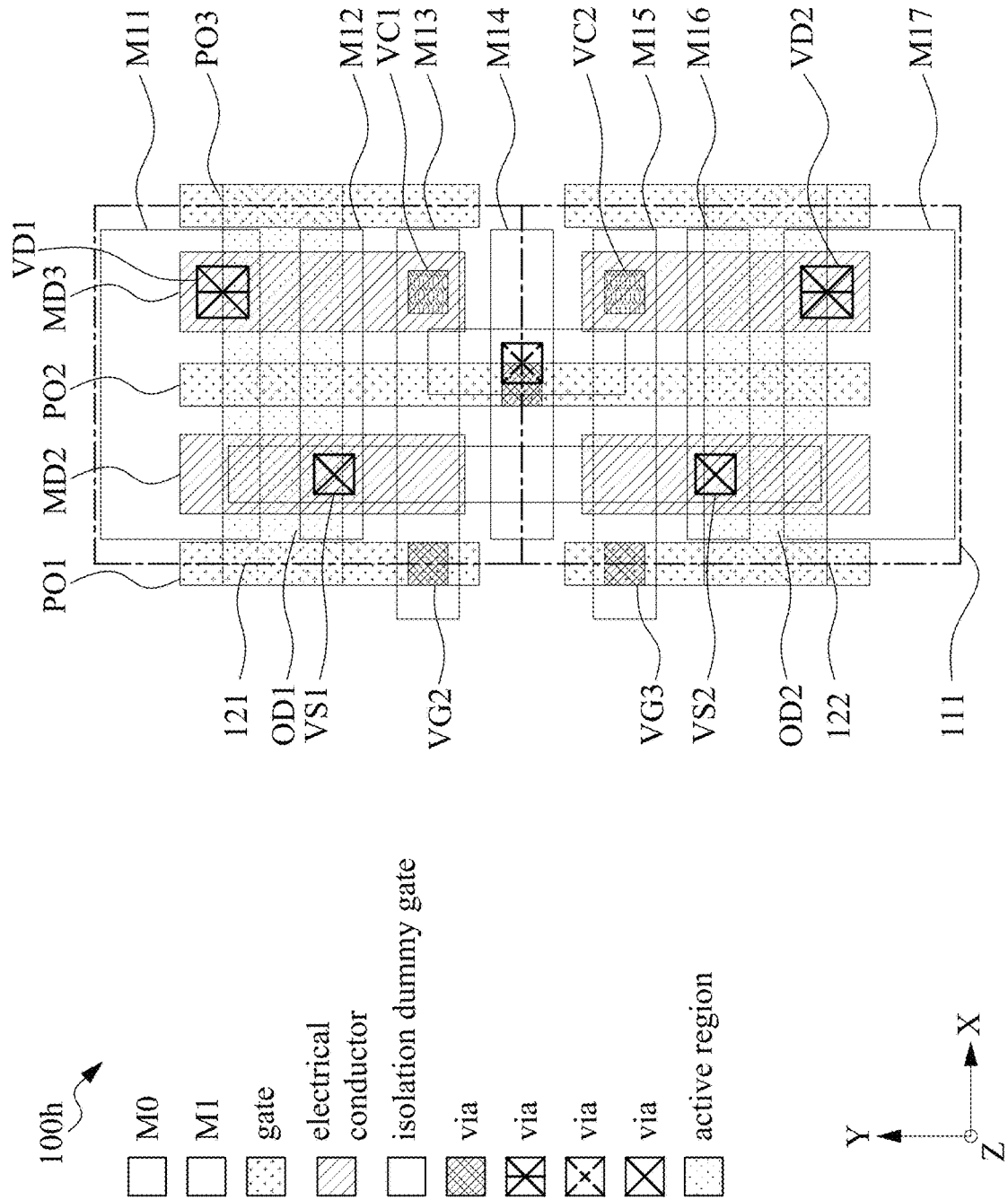
FIG. 8 illustrates a schematic view of a layout of a semiconductor device, in accordance with some embodiments of the present disclosure.

FIG. 8 illustrates a schematic view of a layout of a semiconductor device 100h, in accordance with some embodiments of the present disclosure. The semiconductor device 100h can be similar to the semiconductor device 100g, except that the gate PO3 is electrically isolated from the electrical conductor MD3.

In some embodiments, in the transistor 121, the gate PO3 is a floating gate or free from being electrically connected to a supply voltage. In some embodiments, in the transistor 121, the electrical conductor MD3 is electrically connected to the gate PO1 by the metal feature M13, vias VC1 and VG2. In this embodiment, the active region OD1 can continuously extend at least between the gates PO1 and PO3, and can extend to other abutting cells (not shown). Thus, the length of the active region OD1 is prolonged.

In some embodiments, in the transistor 122, the gate PO3 is a floating gate or free from being electrically connected to a supply voltage. In some embodiments, in the transistor 122, the electrical conductor MD3 is electrically connected to the gate PO1 by the metal feature M15, vias VC2 and VG3. In this embodiment, the active region OD2 can continuously extend at least between the gates PO1 and PO3, and can extend to other abutting cells (not shown). Thus, the length of the active region OD2 is prolonged.

Figure 9:
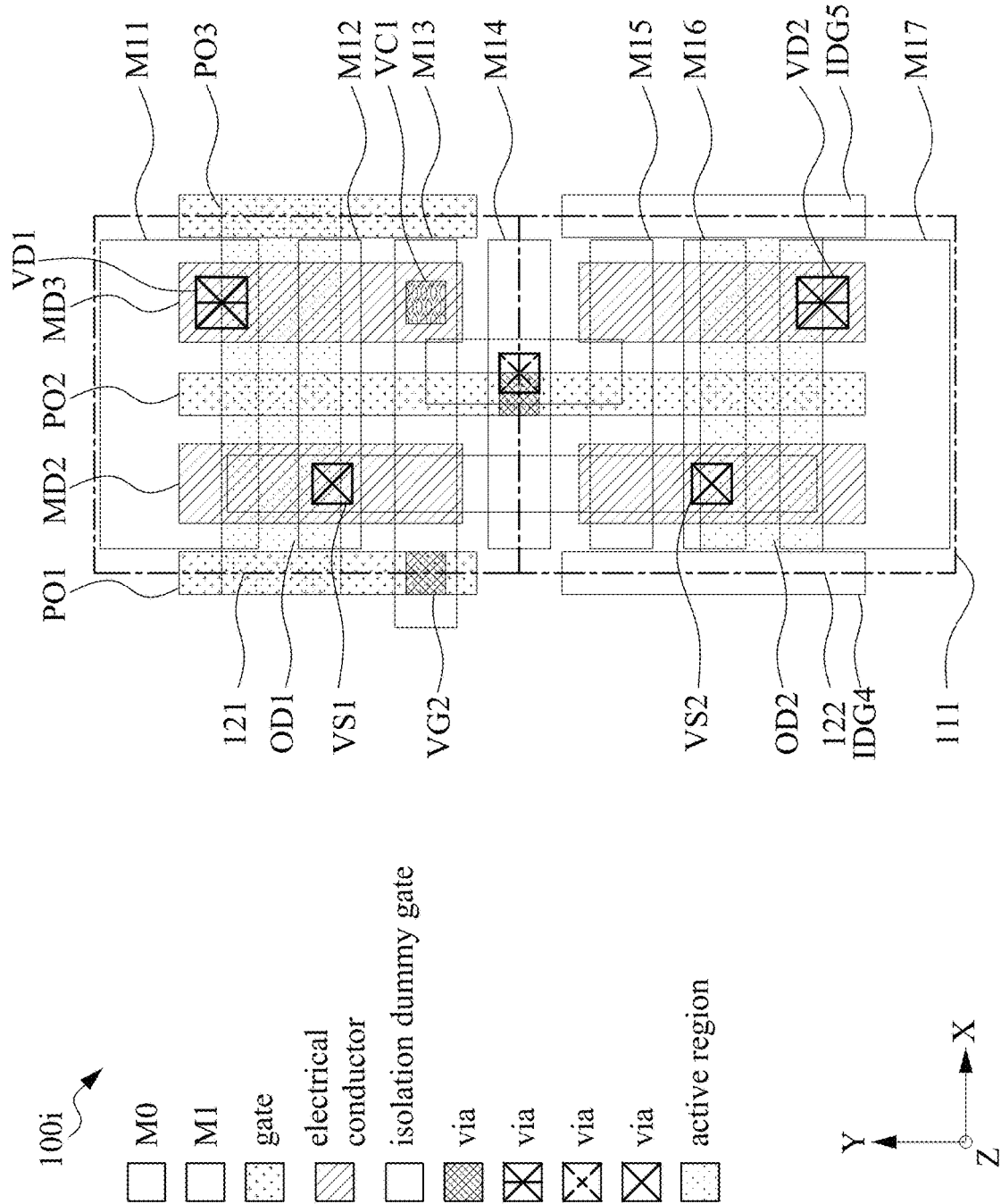
FIG. 9 illustrates a schematic view of a layout of a semiconductor device, in accordance with some embodiments of the present disclosure.

FIG. 9 illustrates a schematic view of a layout of a semiconductor device 100i, in accordance with some embodiments of the present disclosure. The semiconductor device 100i can be similar to the semiconductor device 100h, except that the semiconductor device 100i includes isolation dummy gates IDG4 and IDG5.

In some embodiments, the isolation dummy gates IDG4 and IDG5 are disposed on the cell edge of the cell 111. In some embodiments, the isolation dummy gates IDG4 and IDG5 are disposed in the transistor 122. In this embodiment, the active region OD1 can continuously extend at least between the gates PO1 and PO3, and can extend to other abutting cells (not shown). Thus, the length of the active region OD1 is prolonged. In this embodiment, the active region OD2 terminates at the isolation dummy gate IDG4 and at the isolation dummy gate IDG5. Therefore, the active regions OD1 and OD2 have different lengths.

Figure 10:
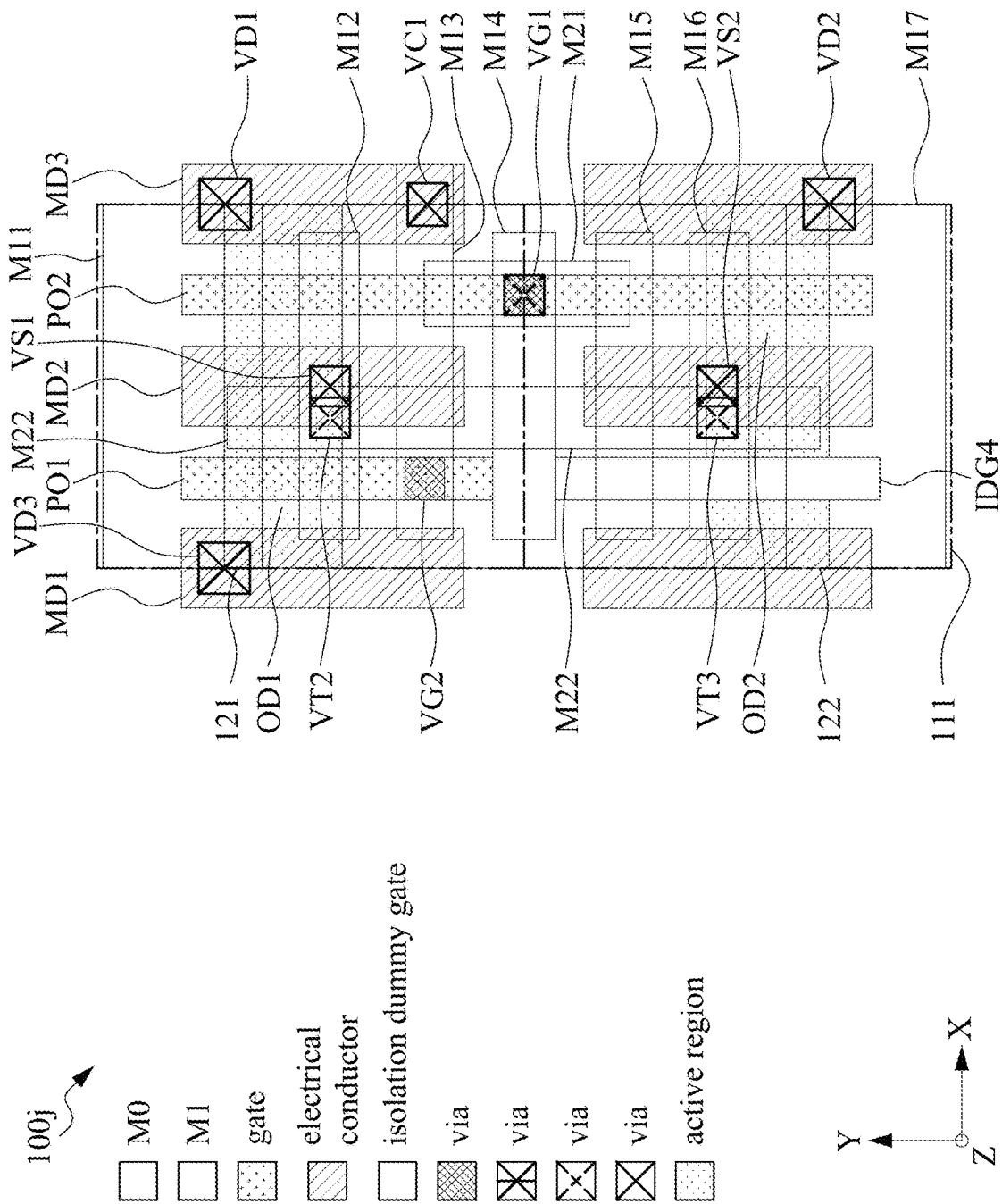
FIG. 10 illustrates a schematic view of a layout of a semiconductor device, in accordance with some embodiments of the present disclosure.

FIG. 10 illustrates a schematic view of a layout of a semiconductor device 100j, in accordance with some embodiments of the present disclosure. The semiconductor device 100j can be similar to the semiconductor device 100a, except that the electrical conductors MD1 and MD3 are disposed on the cell edge of the cell 111.

In some embodiments, in the transistor 121, the electrical conductor MD1 is electrically connected to the electrical conductor MD3 through the metal feature M11, vias VD1 and VD3. The gate PO1 is electrically connected to the electrical conductor MD3 through the metal feature M13, vias VC1 and VG2. In this embodiment, in the transistor 121, the electrical conductors MD1, MD3, and the gate PO1 are electrically connected to the same supply voltage. In this embodiment, the active region OD1 can continuously extend at least between the electrical conductors MD1 and MD3, and can extend to other abutting cells (not shown). Thus, the length of the active region OD1 is prolonged.

In this embodiment, the isolation dummy gate IDG4 is disposed in the transistor 122. The active region OD2 terminates at the right side of the isolation dummy gate IDG4. Therefore, the active regions OD1 and OD2 have different lengths in the cell 111.

Figure 11:
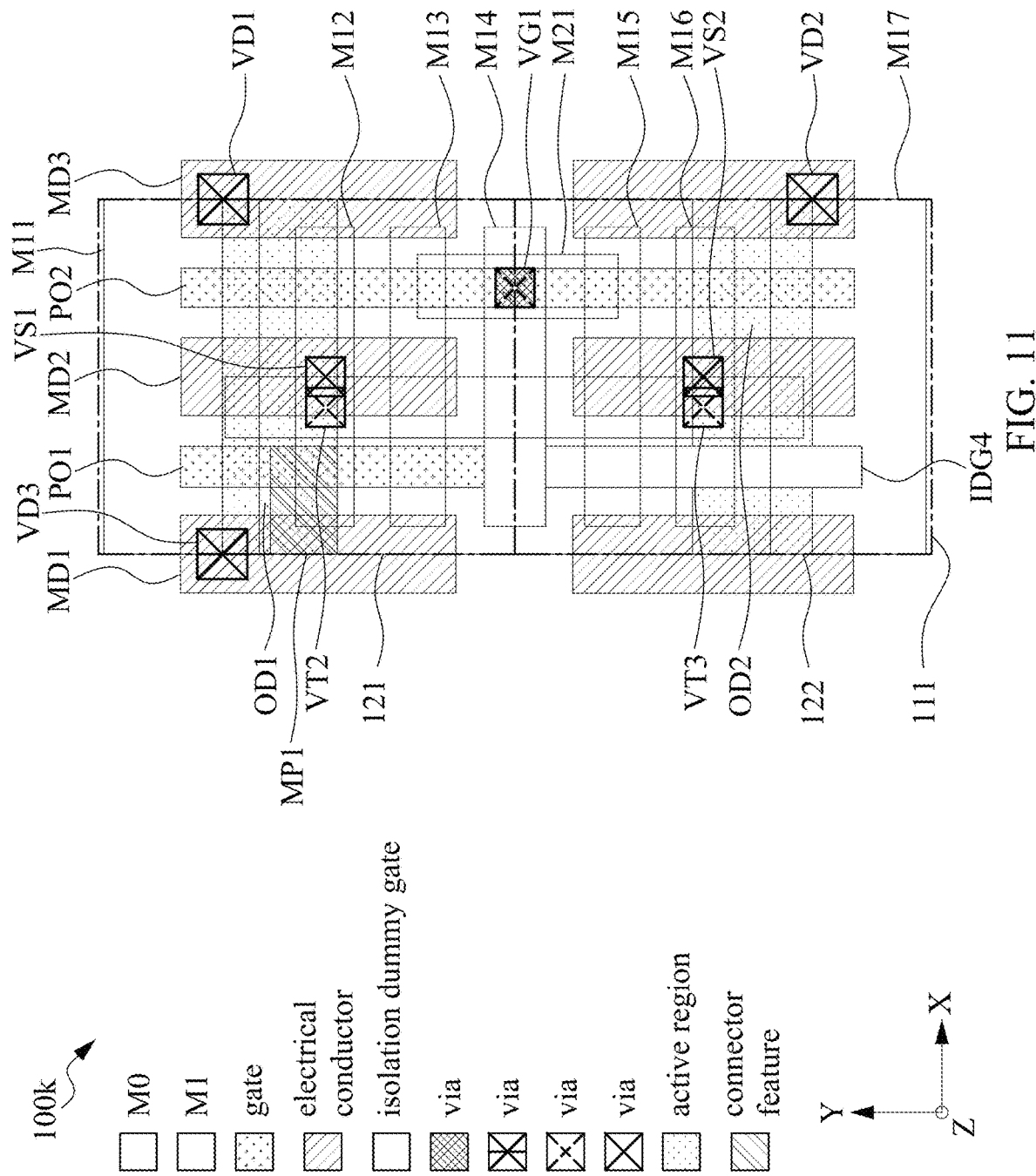
FIG. 11 illustrates a schematic view of a layout of a semiconductor device, in accordance with some embodiments of the present disclosure.

FIG. 11 illustrates a schematic view of a layout of a semiconductor device 100k, in accordance with some embodiments of the present disclosure. The semiconductor device 100k can be similar to the semiconductor device 100j, except that the semiconductor device 100k further includes the connect feature MP1.

In some embodiments, the connect feature MP1 electrically connects the electrical conductor MD1 and the gate PO1. In some embodiments, in the transistor 121, the electrical conductors MD1, MD3, and the gate PO1 can be electrically connected to the same supply voltage. In this embodiment, the active region OD1 can continuously extend at least between the electrical conductors MD1 and MD3, and can extend to other abutting cells (not shown). Thus, the length of the active region OD1 may be prolonged. The active region OD2 terminates at the right side of the isolation dummy gate IDG4. Therefore, the active regions OD1 and OD2 have different lengths in the cell 111.

Figure 12:
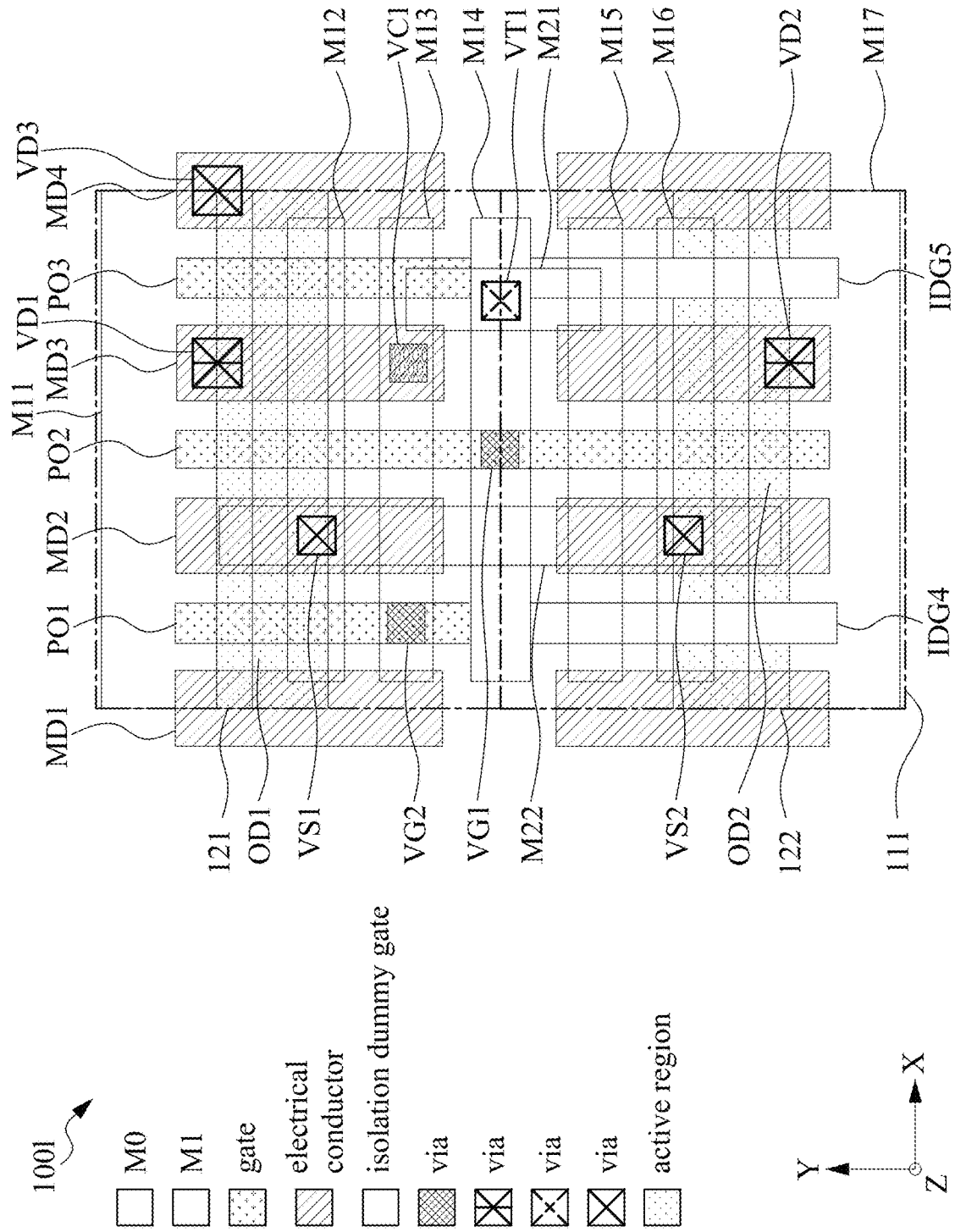
FIG. 12 illustrates a schematic view of a layout of a semiconductor device, in accordance with some embodiments of the present disclosure.

FIG. 12 illustrates a schematic view of a layout of a semiconductor device 100l, in accordance with some embodiments of the present disclosure. The semiconductor device 100l can be similar to the semiconductor device 100k, except that the semiconductor device 100l further includes the gate PO3, the electrical conductor MD4, and the isolation dummy gate IDG5.

In some embodiments, the electrical conductors MD1 and MD4 are disposed on the cell edge of the cell 111. In some embodiments, the electrical conductor MD3 is electrically connected to the electrical conductor MD4 through the vias VD1, VD3, and metal feature M11. In some embodiments, the electrical conductor MD3 is electrically connected to the gate PO1 through the vias VC1, VG2, and the metal feature M13. In some embodiments, in the transistor 121, the electrical conductors MD3, MD4, and the gate PO1 are electrically connected to the same supply voltage. In this embodiment, the active region OD1 can continuously extend at least between the electrical conductors MD1 and MD4, and further continuously extend to other abutting cells (not shown).

In this embodiment, the isolation dummy gate IDG5 is disposed in the transistor 122. In some embodiments, the active region OD2 can continuously extend between the isolation dummy gates IDG4 and IDG5, and terminate at the isolation dummy gates IDG4 and IDG5. Therefore, the active regions OD1 and OD2 have different lengths.

Figure 13:
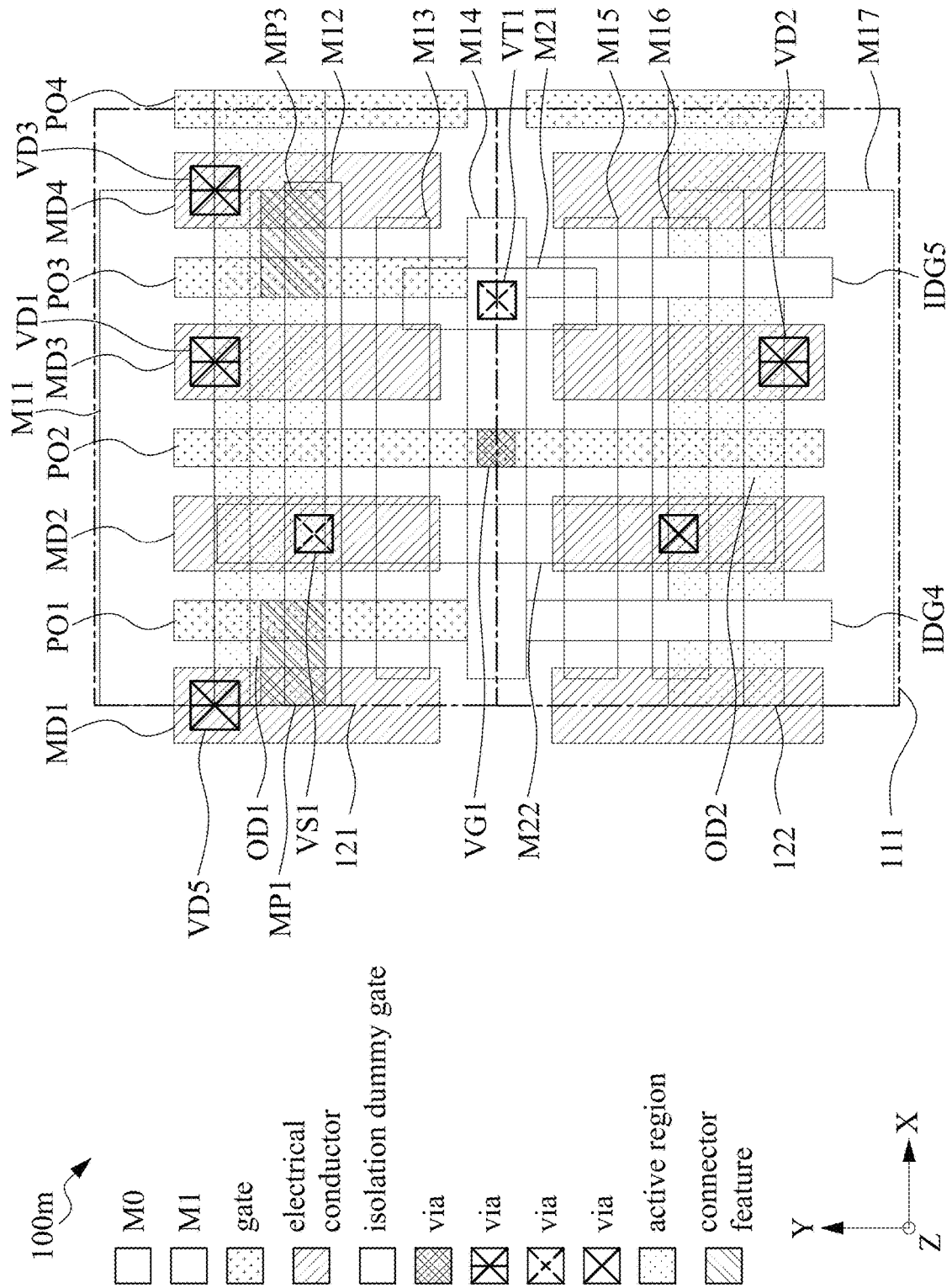
FIG. 13 illustrates a schematic view of a layout of a semiconductor device, in accordance with some embodiments of the present disclosure.

FIG. 13 illustrates a schematic view of a layout of a semiconductor device 100m, in accordance with some embodiments of the present disclosure. The semiconductor device 100m can be similar to the semiconductor device 100l, except that the semiconductor device 100m includes the gate PO4.

In some embodiments, the electrical conductor MD1 and the gate PO4 are disposed on the cell edge of the cell 111. In some embodiments, the gate PO4 is a floating gate or free from being electrically connected to a supply voltage. In some embodiments, in the transistor 121, the electrical conductors MD1, MD3, and MD4 are electrically connected to each other through the metal feature M11, vias VD1, VD3, and VD5. In some embodiments, in the transistor 121, the electrical conductor MD1 is electrically connected to the gate PO1 by the connect feature MP1. In some embodiments, in the transistor 121, the electrical conductor MD4 is electrically connected to the gate PO3 by a connect feature MP3. In this embodiment, in the transistor 121, the electrical conductors MD1, MD3 and MD4 as well as the gates PO1 and PO3 are electrically connected to the same supply voltage. In this embodiment, the active region OD1 can continuously extend at least between the electrical conductor MD1 and the gate PO4, and further continuously extend to other abutting cells (not shown). In this embodiment, the active region OD2 can continuously extend between the isolation dummy gates IDG4 and IDG5, and terminate at the isolation dummy gates IDG4 and IDG5. Therefore, the active regions OD1 and OD2 have different lengths.

Figure 14A:
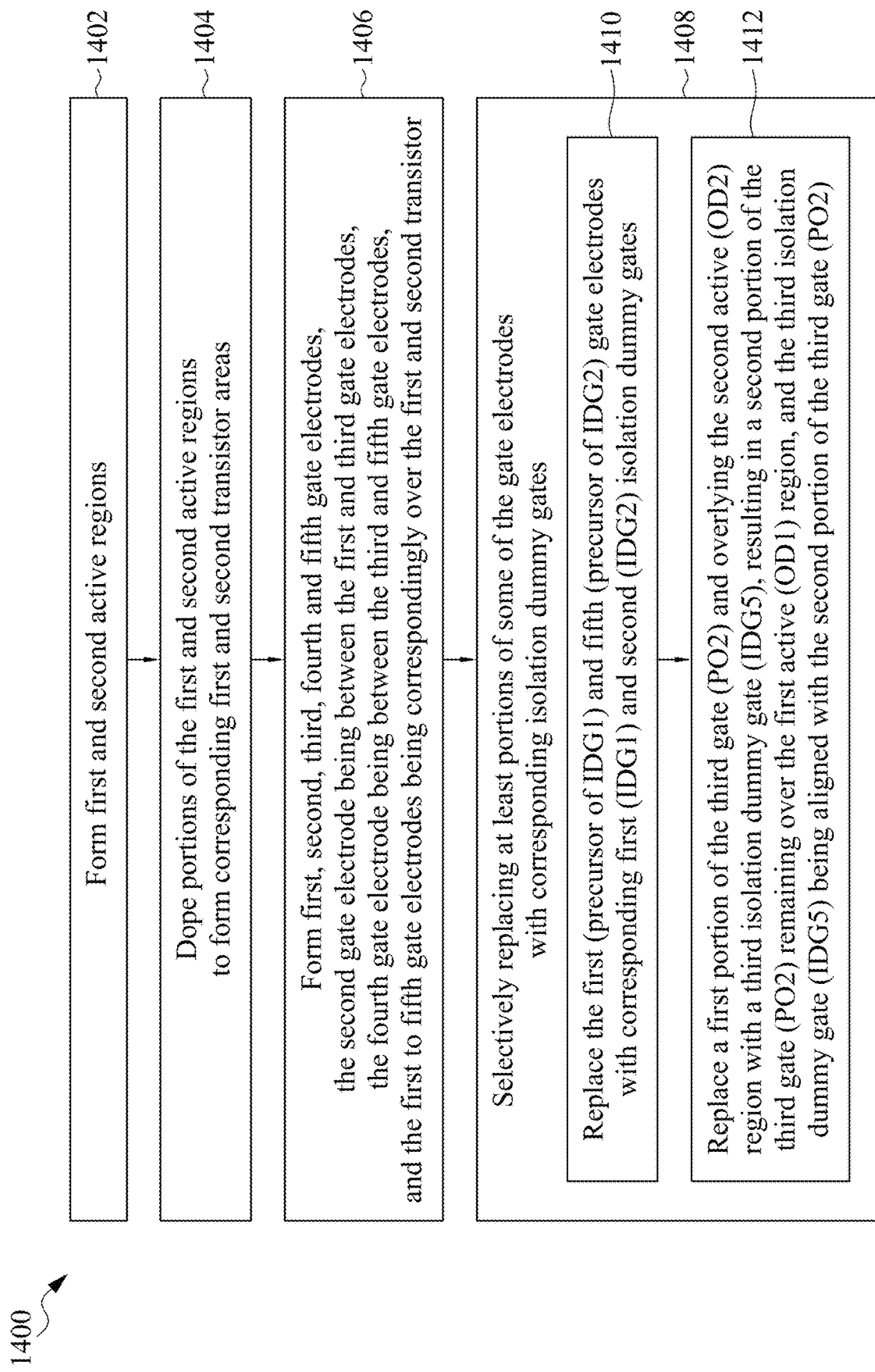
FIG. 14A is a flow chart illustrating a method for manufacturing a semiconductor device, in accordance with some embodiments of the present disclosure.

FIG. 14A is a flow chart illustrating a method 1400 for manufacturing a semiconductor device according to various aspects of the present disclosure.

FIG. 14A includes blocks 1402-1412. At block 1402, first and second active regions extending in a first direction are formed. Examples of the first and second active regions extending in a first direction include corresponding active regions OD1 and OD2 of FIG. 6 that extend parallel to the X-axis, or the like. From block 1402, flow proceeds to block 1404.

At block 1404, portions of the first and second active regions are doped to form corresponding first and second transistor areas. Examples of portions of the first and second active regions being doped to form corresponding first and second transistor areas include instances of S/D feature 151 (see FIG. 3A, or the like) in corresponding active regions OD1 and OD2 of FIG. 6A, or the like. From block 1404, flow proceeds to block 1406.

At block 1406, first, second, third, fourth and fifth gate electrodes are formed that extend in a second direction perpendicular to the first direction, the second gate electrode being between the first and third gate electrodes, the fourth gate electrode being between the third and fifth gate electrodes, and the first to fifth gate electrodes being correspondingly over the first and second transistor areas of the corresponding first and second active regions. Examples of first, second, third, fourth and fifth gate electrodes that extend in a second direction include correspondingly the gate electrode which was the precursor of isolation dummy gate IDG1, gate PO1, gate PO2, gate PO3, the gate electrode which was the precursor of isolation dummy gate IDG2 in FIG. 6, or the like. In FIG. 6, it is noted that gate PO1 is between the gate-precursor of isolation dummy gate IDG1 and gate PO2, and that gate PO3 is between gate PO2 and the gate-precursor of isolation dummy gate IDG2. From block 1406, flow proceeds to block 1408.

At block 1408, at least portions of some of the gate electrodes are selectively replaced with corresponding isolation dummy gates. Examples of at least portions of some of the gate electrodes being selectively replaced with corresponding isolation dummy gates includes correspondingly the entirety of the gate-precursor of isolation dummy gate IDG1, a portion of gate PO2 and the entirety of the gate-precursor of isolation dummy gate IDG2 in FIG. 6, or the like. Block 1408 includes blocks 1410-1412.

At block 1410, the first and fifth gate electrodes are replaced with corresponding first and second isolation dummy gates. Examples of the first and fifth gate electrodes are replaced with corresponding first and second isolation dummy gates include correspondingly the entirety of the gate-precursor of isolation dummy gate IDG1 and the entirety of the gate-precursor of isolation dummy gate IDG2 in FIG. 6, or the like. From block 1410, flow proceeds to block 1412.

At block 1412, a first portion of the third gate overlying the second active region is replaced with a third isolation dummy gate, resulting in a second portion of the third gate remaining over the first active region, and the third isolation dummy gate being aligned with the second portion of the third gate. An example of a first portion of the third gate overlying the second active region being replaced with a third isolation dummy gate is the portion of gate PO2 over active region OD2 which was replaced resulting in isolation dummy gate IDG5 in FIG. 6, or the like. In FIG. 6, it is noted that isolation dummy gate IDG5 is aligned with the remaining portion of gate PO2.

Figure 14B:
FIG. 14B is a flow chart of a method for manufacturing a semiconductor device, in accordance with some embodiments of the present disclosure.

FIG. 14B is a flowchart of a method 1420 of manufacturing a semiconductor device, in accordance with some embodiments.

Method 1420 is implementable, for example, using EDA system 1500 (FIG. 15, discussed below) and an integrated circuit (IC), manufacturing system 1600 (FIG. 16, discussed below), in accordance with some embodiments. Examples of a semiconductor device which can be manufactured according to method 1420 include the semiconductor devices disclosed herein, semiconductor devices corresponding to various ones of the layout diagrams disclosed herein, or the like.

In FIG. 14B, method 1420 includes blocks 1422-1424. At block 1422, a layout diagram is generated which, among other things, includes one or more of layout diagrams disclosed herein, e.g., a layout diagram resulting from method 1200 of FIG. 12, or the like. Block 1422 is implementable, for example, using EDA system 1500 (FIG. 15, discussed below), in accordance with some embodiments. From block 1422, flow proceeds to block 1424.

At block 1424, based on the layout diagram, at least one of (A) one or more photolithographic exposures are made or (B) one or more semiconductor masks are fabricated or (C) one or more components in a layer of a semiconductor device are fabricated. See discussion below of IC manufacturing system 1600 in FIG. 16 below.

Figure 15:
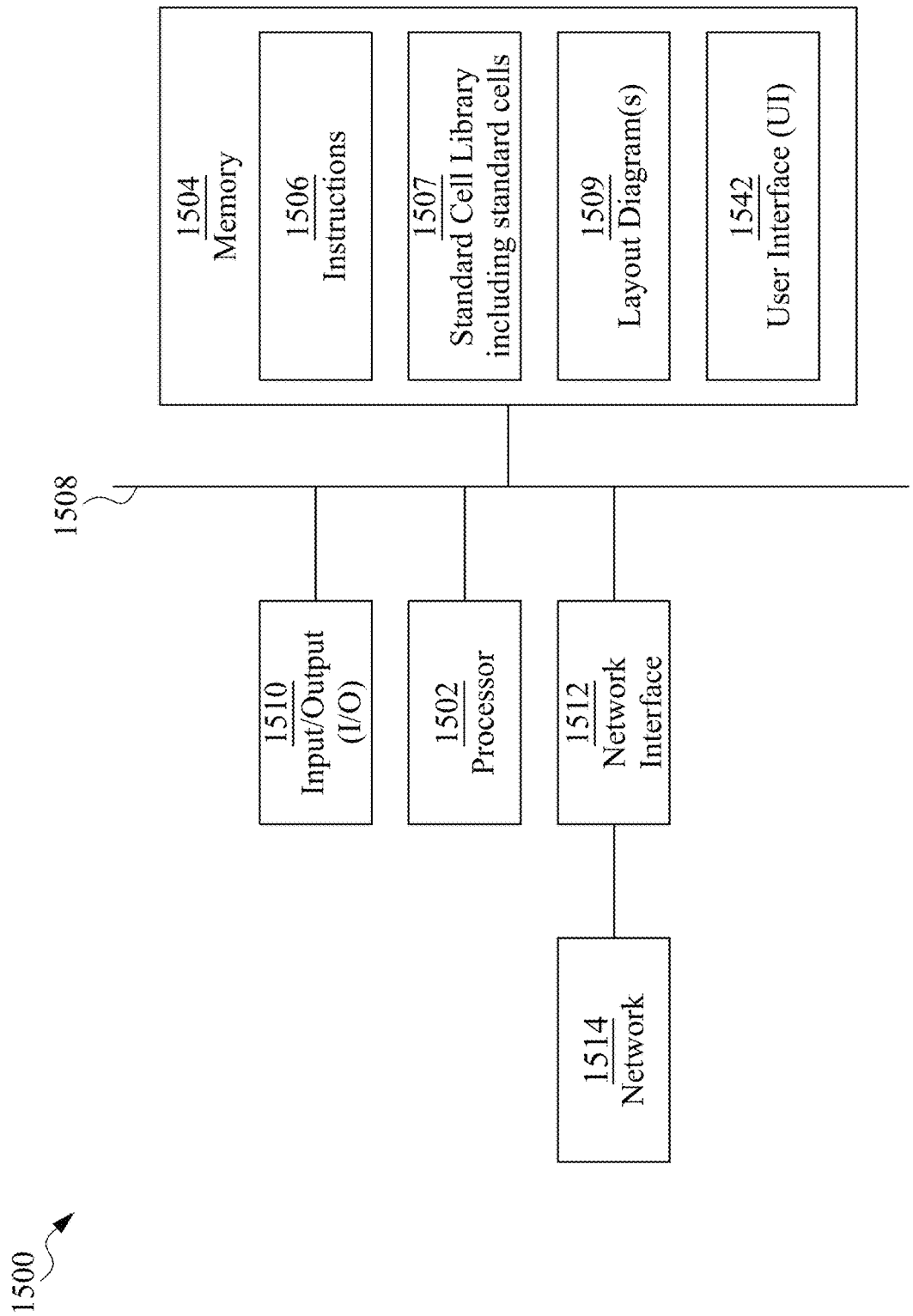
FIG. 15 is a block diagram of a system, in accordance with some embodiments of the present disclosure.

FIG. 15 is a block diagram of an electronic design automation (EDA) system 1500 in accordance with some embodiments.

In some embodiments, EDA system 1500 includes an APR system. The method 1400 of the flowchart of FIG. 14B is implemented, for example, using EDA system 1500, in accordance with some embodiments.

In some embodiments, EDA system 1500 is a general purpose computing device including a hardware processor 1502 and a non-transitory, computer-readable storage medium 1504. Storage medium 1504, amongst other things, is encoded with, i.e., stores, computer program code 1506, i.e., a set of executable instructions. Execution of instructions 1506 by hardware processor 1502 represents (at least in part) an EDA tool which implements a portion or all of, e.g., the methods of FIGS. 12-14, in accordance with one or more embodiments (hereinafter, the noted processes and/or methods).

Processor 1502 is electrically coupled to computer-readable storage medium 1504 via a bus 1508. Processor 1502 is further electrically coupled to an I/O interface 1510 by bus 1508. A network interface 1512 is further electrically connected to processor 1502 via bus 1508. Network interface 1512 is connected to a network 1514, so that processor 1502 and computer-readable storage medium 1504 are capable of connecting to external elements via network 1514. Processor 1502 is configured to execute computer program code 1506 encoded in computer-readable storage medium 1504 in order to cause system 1500 to be usable for performing a portion or all of the noted processes and/or methods. In one or more embodiments, processor 1502 is a central processing unit (CPU), a multi-processor, a distributed processing system, an application specific integrated circuit (ASIC), and/or a suitable processing unit.

In one or more embodiments, computer-readable storage medium 1504 is an electronic, magnetic, optical, electromagnetic, infrared, and/or a semiconductor system (or apparatus or device). For example, computer-readable storage medium 1504 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1504 includes a compact disk-read only memory (CD-ROM), a compact disk-read/write (CD-R/W), and/or a digital video disc (DVD).

In one or more embodiments, storage medium 1504 stores computer program code 1506 configured to cause system 1500 (where such execution represents (at least in part) the EDA tool) to be usable for performing a portion or all of the noted processes and/or methods. In one or more embodiments, storage medium 1504 further stores information which facilitates performing a portion or all of the noted processes and/or methods. In one or more embodiments, storage medium 1504 stores library 1507 of standard cells including such standard cells as disclosed herein.

EDA system 1500 includes I/O interface 1510. I/O interface 1510 is coupled to external circuitry. In one or more embodiments, I/O interface 1510 includes a keyboard, keypad, mouse, trackball, trackpad, touchscreen, and/or cursor direction keys for communicating information and commands to processor 1502.

EDA system 1500 further includes network interface 1512 coupled to processor 1502. Network interface 1512 allows system 1500 to communicate with network 1514, to which one or more other computer systems are connected. Network interface 1512 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1500.

System 1500 is configured to receive information through I/O interface 1510. The information received through I/O interface 1510 includes one or more of instructions, data, design rules, libraries of standard cells, and/or other parameters for processing by processor 1502. The information is transferred to processor 1502 via bus 1508. EDA system 1500 is configured to receive information related to a UI through I/O interface 1510. The information is stored in computer-readable medium 1504 as user interface (UI) 1542.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1500. In some embodiments, a layout which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 16:
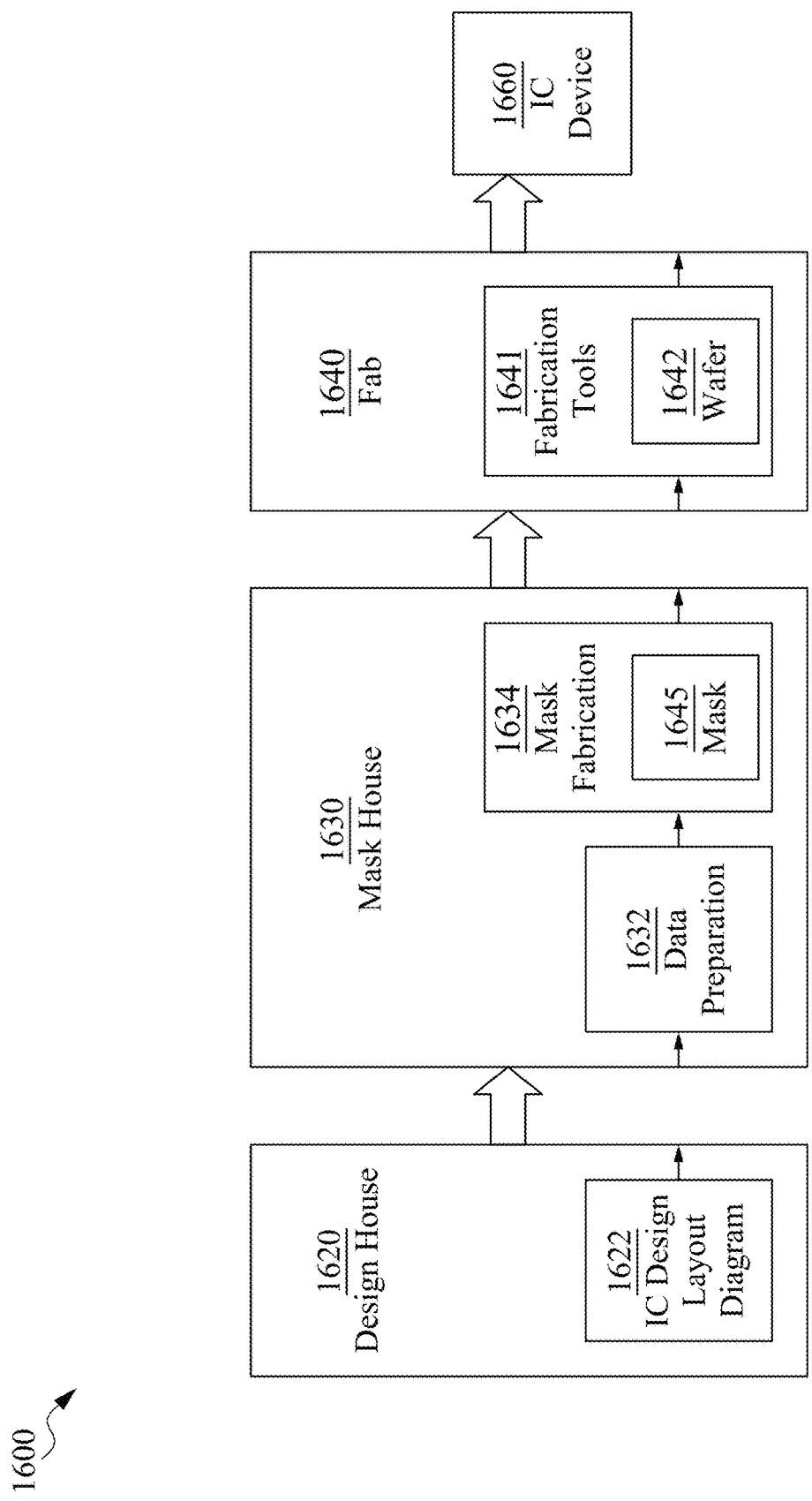
FIG. 16 is a block diagram of a system, in accordance with some embodiments of the present disclosure.

FIG. 16 is a block diagram of an integrated circuit (IC) manufacturing system 1600, and an IC manufacturing flow associated therewith, in accordance with some embodiments. In some embodiments, system 1600 of FIG. 16 is used to implement block 1424 of FIG. 14B.

In FIG. 16, IC manufacturing system 1600 includes entities, such as a design house 1620, a mask house 1630, and an IC manufacturer/fabricator ("fab") 1640, that interact with one another in the design, development, and manufacturing cycles and/or services related to manufacturing an IC device 1660. The entities in system 1600 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and supplies services to and/or receives services from one or more of the other entities. In some embodiments, two or more of design house 1620, mask house 1630, and IC fab 1640 is owned by a single larger company. In some embodiments, two or more of design house 1620, mask house 1630, and IC fab 1640 coexist in a common facility and use common resources.

Design house (or design team) 1620 generates an IC design layout 1622. IC design layout 1622 includes various geometrical patterns designed for an IC device 1660. The geometrical patterns correspond to patterns of metal, oxide, or semiconductor layers that make up the various components of IC device 1660 to be fabricated. The various layers combine to form various IC features. For example, a portion of IC design layout 1622 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1620 implements a proper design procedure to form IC design layout 1622. The design procedure includes one or more of logic design, physical design or place and route. IC design layout 1622 is presented in one or more data files having information of the geometrical patterns. For example, IC design layout 1622 is expressed in a GDSII file format or DFII file format.

Mask house 1630 includes data preparation 1632 and mask fabrication 1634. Mask house 1630 uses IC design layout 1622 to manufacture one or more masks to be used for fabricating the various layers of IC device 1660 according to IC design layout 1622. Mask house 1630 performs mask data preparation 1632, where IC design layout 1622 is translated into a representative data file ("RDF"). Mask data preparation 1632 supplies the RDF to mask fabrication 1634. Mask fabrication 1634 includes a mask writer. A mask writer converts the RDF to an image on a substrate, such as a mask (reticle) or a semiconductor wafer. The design layout is manipulated by mask data preparation 1632 to comply with particular characteristics of the mask writer and/or requirements of IC fab 1640. In FIG. 16, mask data preparation 1632, mask fabrication 1634, and mask 1645 are illustrated as separate elements. In some embodiments, mask data preparation 1632 and mask fabrication 1634 are collectively referred to as mask data preparation.

In some embodiments, mask data preparation 1632 includes optical proximity correction (OPC) which uses lithography enhancement techniques to compensate for image errors, such as those that can arise from diffraction, interference, other process effects and the like. OPC adjusts IC design layout 1622. In some embodiments, mask data preparation 1632 includes further resolution enhancement techniques (RET), such as off-axis illumination, sub-resolution assist features, phase-shifting masks, other suitable techniques, and the like or combinations thereof. In some embodiments, inverse lithography technology (ILT) is further used, which treats OPC as an inverse imaging problem.

In some embodiments, mask data preparation 1632 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 1634, which may undo part of the modifications performed by OPC in order to meet mask creation rules.

In some embodiments, mask data preparation 1632 includes lithography process checking (LPC) that simulates processing that will be implemented by IC fab 1640 to fabricate IC device 1660. LPC simulates this processing based on IC design layout 1622 to create a simulated manufactured device, such as IC device 1660. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are repeated to further refine IC design layout 1622.

It is understood that the above description of mask data preparation 1632 has been simplified for the purposes of clarity. In some embodiments, data preparation 1632 includes additional features such as a logic operation (LOP) to modify the IC design layout according to manufacturing rules. Additionally, the processes applied to IC design layout 1622 during data preparation 1632 may be executed in a variety of different orders.

After mask data preparation 1632 and during mask fabrication 1634, a mask 1645 or a group of masks are fabricated based on the modified IC design layout. In some embodiments, an electron-beam (e-beam) or a mechanism of multiple e-beams is used to form a pattern on a mask (photomask or reticle) based on the modified IC design layout. The masks are formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask is an attenuated PSM or alternating PSM. The mask(s) generated by mask fabrication 1634 is used in a variety of processes. For example, such a mask(s) is used in an ion implantation process to form various doped regions in the semiconductor wafer, in an etching process to form various etching regions in the semiconductor wafer, and/or in other suitable processes.

IC fab 1640 is an IC fabrication business that includes one or more manufacturing facilities for the fabrication of a variety of different IC products. For example, IC fab 1640 can include one or more fabrication tools 1641. In some embodiments, IC Fab 1640 is a semiconductor foundry. For example, there may be a manufacturing facility for the front end fabrication of a plurality of IC products (front-end-of-line (FEOL) fabrication), while a second manufacturing facility may supply the back end fabrication for the interconnection and packaging of the IC products (back-end-of-line (BEOL) fabrication), and a third manufacturing facility may supply other services for the foundry business.

IC fab 1640 uses the mask (or masks) fabricated by mask house 1630 to fabricate IC device 1660. Thus, IC fab 1640 at least indirectly uses IC design layout 1622 to fabricate IC device 1660. In some embodiments, a semiconductor wafer 1642 is fabricated by IC fab 1640 using the mask (or masks) to form IC device 1660. Semiconductor wafer 1642 includes a silicon substrate or other proper substrate having material layers formed thereon. Semiconductor wafer further includes one or more of various doped regions, isolation dummy features, multilevel interconnects, and the like (formed at subsequent manufacturing steps).

Details regarding an integrated circuit (IC) manufacturing system (e.g., system 1600 of FIG. 16), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

Some embodiments of the present disclosure provide a semiconductor device. The semiconductor device includes a first isolation dummy gate extending along a first direction. The semiconductor device also includes a second isolation dummy gate extending along the first direction. The semiconductor device further includes a first gate extending along the first direction and between the first isolation dummy gate and the second isolation dummy gate. The semiconductor device includes a second gate extending along the first direction, the second gate being between the first isolation dummy gate and the second isolation dummy gate relative to a second direction perpendicular to the first direction. The semiconductor device also includes a first active region extending in the second direction between the first isolation dummy gate and the second isolation dummy gate. The semiconductor device further includes a second active region. The first active region has a first length in the second direction, and the second active region has a second length in the second direction different from the first length.

Some embodiments of the present disclosure provide a semiconductor device. The semiconductor device includes a first gate, a second gate and a third gate extending along a first direction and arranged along a second direction different from the first direction, the second gate being between the first and third gates. The semiconductor device also includes a first isolation dummy gate extending along the first direction and aligned to the second gate in the first direction. The semiconductor device further includes a first active region extending along the second direction and extending between the first gate and the third gate. In addition, the semiconductor device includes a second active region extending along the second direction and extending between the first gate and the first isolation dummy gate.

In some embodiments, a method (of manufacturing a semiconductor device) includes: forming first and second active regions extending in a first direction; doping portions of the first and second active regions to form corresponding first and second transistor areas; forming first, second, third, fourth and fifth gate electrodes that extend in a second direction perpendicular to the first direction, the second gate electrode being between the first and third gate electrodes, the fourth gate electrode being between the third and fifth gate electrodes, and the first to fifth gate electrodes being correspondingly over the first and second transistor areas of the corresponding first and second active regions; and selectively replacing at least portions of some of the gate electrodes with corresponding isolation dummy gates, the selectively replacing including replacing the first and fifth gate electrodes with corresponding first and second isolation dummy gates, and replacing a first portion of the third gate overlying the second active region with a third isolation dummy gate, resulting in a second portion of the third gate remaining over the first active region, and the third isolation dummy gate being aligned with the second portion of the third gate. In some embodiments, the replacing a first portion of the third gate further results in the following: a first portion of the second gate overlies the second active region and is between the first and third isolation dummy gates; and a second portion of the second gate overlies the first active region and is between the first isolation dummy gate and the second gate.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A cell region of a semiconductor device, the cell region comprising:
  a first isolation dummy gate extending along a first direction;
  a second isolation dummy gate extending along the first direction;
  a first gate extending along the first direction and being between the first isolation dummy gate and the second isolation dummy gate;
  a second gate extending along the first direction, the second gate being between the first isolation dummy gate and the second isolation dummy gate relative to a second direction perpendicular to the first direction;
  a first active region extending in the second direction between the first isolation dummy gate and the second isolation dummy gate; and
  a second active region,
  wherein:
    the first isolation dummy gate is in a trench that extends through the first active region and the second active region;
    the second isolation dummy gate is in a trench that extends through the first active region and the second active region;
    the first active region has a first length in the second direction; and
    the second active region has a second length in the second direction different from the first length.

2. The cell region of claim 1, further comprising:
  a third isolation dummy gate extending along the first direction;
  wherein:
    the third isolation dummy gate is in a trench that extends through only one of the first active region or the second active region; and
    the third isolation dummy gate is aligned to the second gate relative to the first direction.

3. The cell region of claim 2, wherein:
the first isolation dummy gate includes a dielectric structure in the trench that extends through the first active region and the second active region;
the second isolation dummy gate includes a dielectric structure in the trench that extends through the first active region and the second active region;
the third isolation dummy gate includes a dielectric structure in the trench that extends through only one of the first active region or the second active region;
the first active region continuously extends between the first isolation dummy gate and the second isolation dummy gate; and
the second active region continuously extends between the first isolation dummy gate and the third isolation dummy gate.

4. The cell region of claim 2, wherein:
the first length is determined from an edge of the first isolation dummy gate to an edge of the second isolation dummy gate;
the second length is determined from the edge of the first isolation dummy gate to an edge of the third isolation dummy gate; and
a ratio between the second length and the first length ranges from about 0.05 to about 0.99.

5. The cell region of claim 4, further comprising:
a third active region continuously extending between the second isolation dummy gate and the third isolation dummy gate.

6. The cell region claim 5, wherein the third active region has a third length, and a sum of the second length and the third length is less than the first length.

7. The cell region of claim 1, further comprising:
a first electrical conductor extending along the first direction, the first electrical conductor being between the first gate and the second gate relative to the second direction;
a first metal feature extending along the second direction; and
a first via electrically connecting the first metal feature and the first electrical conductor.

8. The cell region of claim 7, further comprising:
a second electrical conductor extending along the first direction and between the first isolation dummy gate and the first gate,
wherein:
the first gate, the first electrical conductor, and the second electrical conductor are electrically connected to different supply voltages, respectively; and
the first gate, the first electrical conductor, and the second electrical conductor correspond to a same functional transistor.

9. The cell region of claim 8, further comprising:
a third electrical conductor extending along the first direction, the second gate being between the first electrical conductor and the third electrical conductor,
wherein:
the first electrical conductor and the third electrical conductor are electrically connected to a same supply voltage; and
the first electrical conductor and the third electrical conductor correspond to a source and drain electrically connected to each other on opposite sides of the second gate.

10. The cell region of claim 9, further comprising:
a second via electrically connecting the first metal feature and the third electrical conductor.

11. The cell region of claim 9, wherein the second electrical conductor and the third electrical conductor cross the first active region.

12. A semiconductor device, comprising:
a first gate and a second gate extending along a first direction and arranged along a second direction different from the first direction;
a first isolation dummy gate extending along the first direction and aligned to the second gate in the first direction;
a first active region extending along the second direction and crossing the first gate; and
a second active region extending along the second direction, crossing the first gate and continuously extending between the first gate and the first isolation dummy gate,
wherein:
the first isolation dummy gate is in a trench that extends through the first active region and the second active region;
the first active region has a first length in the second direction; and
the second active region has a second length in the second direction different from the first length.

13. The semiconductor device of claim 12, further comprising:
a second isolation dummy gate extending along the first direction,
wherein:
the second isolation dummy gate is in a trench that extends through the first active region and the second active region; and
the second active region continuously extends between the first isolation dummy gate and the second isolation dummy gate.

14. The semiconductor device of claim 13, further comprising:
a third isolation dummy gate,
wherein:
the third isolation dummy gate is in a trench that extends through the first active region and the second active region; and
the first active region continuously extends between the second isolation dummy gate and the third isolation dummy gate.

15. The semiconductor device of claim 12, wherein the second gate is a floating gate.

16. The semiconductor device of claim 12, further comprising:
a first electrical conductor extending along the first direction and disposed between the first gate and the second gate; and
a second electrical conductor extending along the first direction, the second gate being between the first electrical conductor and the second electrical conductor,
wherein:
the first electrical conductor and the second electrical conductor are configured to be electrically connected to a same first electrical supply; and
the first electrical conductor and the second electrical conductor correspond to a source and drain electrically connected to each other on opposite sides of the second gate.

17. The semiconductor device of claim 16, further comprising:
a first metal feature above the second gate and the first electrical conductor; and a first via electrically connecting the first metal feature and the first electrical conductor.

18. The semiconductor device of claim 12, wherein:
the first active region corresponds to a P-type transistor;
the second active region corresponds to an N-type transistor; and
a ratio between the second length and the first length ranges from about 0.05 to about 0.99, such that the P-type transistor has a longer active region than the N-type transistor.

19. The semiconductor device of claim 17, further comprising:
a second via electrically connecting the first metal feature and the second electrical conductor, wherein the first electrical conductor and the second electrical conductor cross the first active region.

20. A semiconductor device, comprising:
a first isolation dummy gate extending in a first direction;
a second isolation dummy gate extending in the first direction;
a third isolation dummy gate extending in the first direction a first gate extending in the first direction and being between the first isolation dummy gate and the second isolation dummy gate relative to a second direction perpendicular to the first direction;
a second gate extending in the first direction and being between the first gate and the second isolation dummy gate relative to the second direction;
a first active region extending in the second direction between the first isolation dummy gate and the second isolation dummy gate;
a second active region extending in the second direction; and
a third active region extending in the second direction,
wherein:
the third isolation dummy gate is aligned with the second gate relative to the first direction;
the second active region is aligned with the third active region relative to the second direction;
the third isolation dummy gate is in a trench that divides the second active region from the third active region; and
a sum of overall lengths of the second active region and the third active region in the second direction is less than an overall length of the first active region in the second direction.

* * * * *